(12) United States Patent
Furuyama

(10) Patent No.: US 7,212,443 B2
(45) Date of Patent: May 1, 2007

(54) NON-VOLATILE MEMORY AND WRITE METHOD OF THE SAME

(75) Inventor: Takaaki Furuyama, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/062,662

(22) Filed: Feb. 23, 2005

(65) Prior Publication Data
US 2005/0141277 A1    Jun. 30, 2005

Related U.S. Application Data

(63) Continuation of application No. PCT/JP03/16157, filed on Dec. 17, 2003.

(30) Foreign Application Priority Data
Dec. 20, 2002 (JP) .............................. 2002-370278

(51) Int. Cl.
*G11C 16/04* (2006.01)
(52) U.S. Cl. ............. 365/185.18; 365/226; 365/189.04
(58) Field of Classification Search ............ 365/185.18
See application file for complete search history.

(56) References Cited
U.S. PATENT DOCUMENTS
5,371,697 A * 12/1994 Yamada ....................... 365/49

5,574,684 A * 11/1996 Tomoeda ................ 365/185.04

FOREIGN PATENT DOCUMENTS

| JP | 62-076098 | 4/1987 |
|----|-----------|--------|
| JP | 05-342892 | 12/1993 |
| JP | 06-251594 | 9/1994 |
| JP | 08-031186 | 2/1996 |
| JP | 08-190797 | 7/1996 |
| JP | 11-177068 | 7/1999 |
| JP | 2001-358237 | 12/2001 |
| JP | 2003-124362 | 4/2003 |

* cited by examiner

*Primary Examiner*—Thong Q. Le
(74) *Attorney, Agent, or Firm*—Arent Fox LLP

(57) ABSTRACT

A non-volatile memory in which a plurality of memory cells connected to a same word line are entirely written with data. Source lines SL separated from each other in column units is arranged on each memory cell of a memory cell array. When writing data, one of either a first or a second source voltage is applied to each source line in accordance with data that is to be written. After a first control voltage of negative voltage is applied, a second control voltage of high voltage is applied to the word line with the voltage of each source line SL in a maintained state. Therefore, each memory cell is erased or programmed in accordance with the voltage applied to the respective source line.

34 Claims, 19 Drawing Sheets

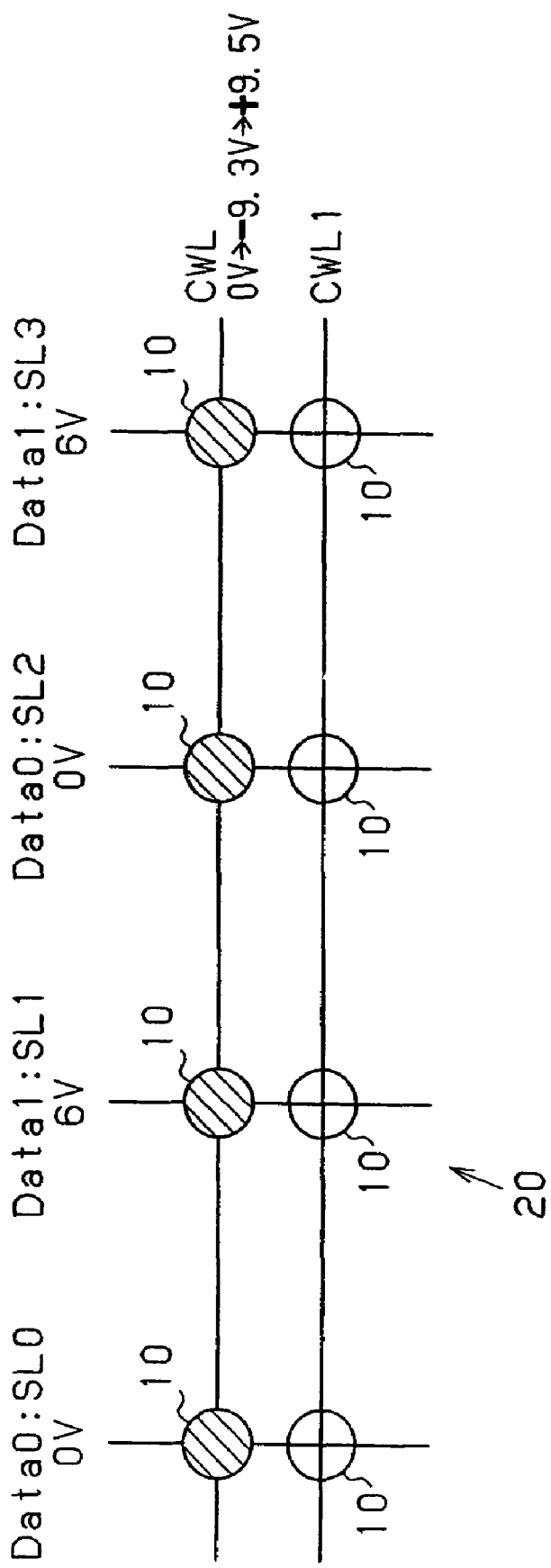

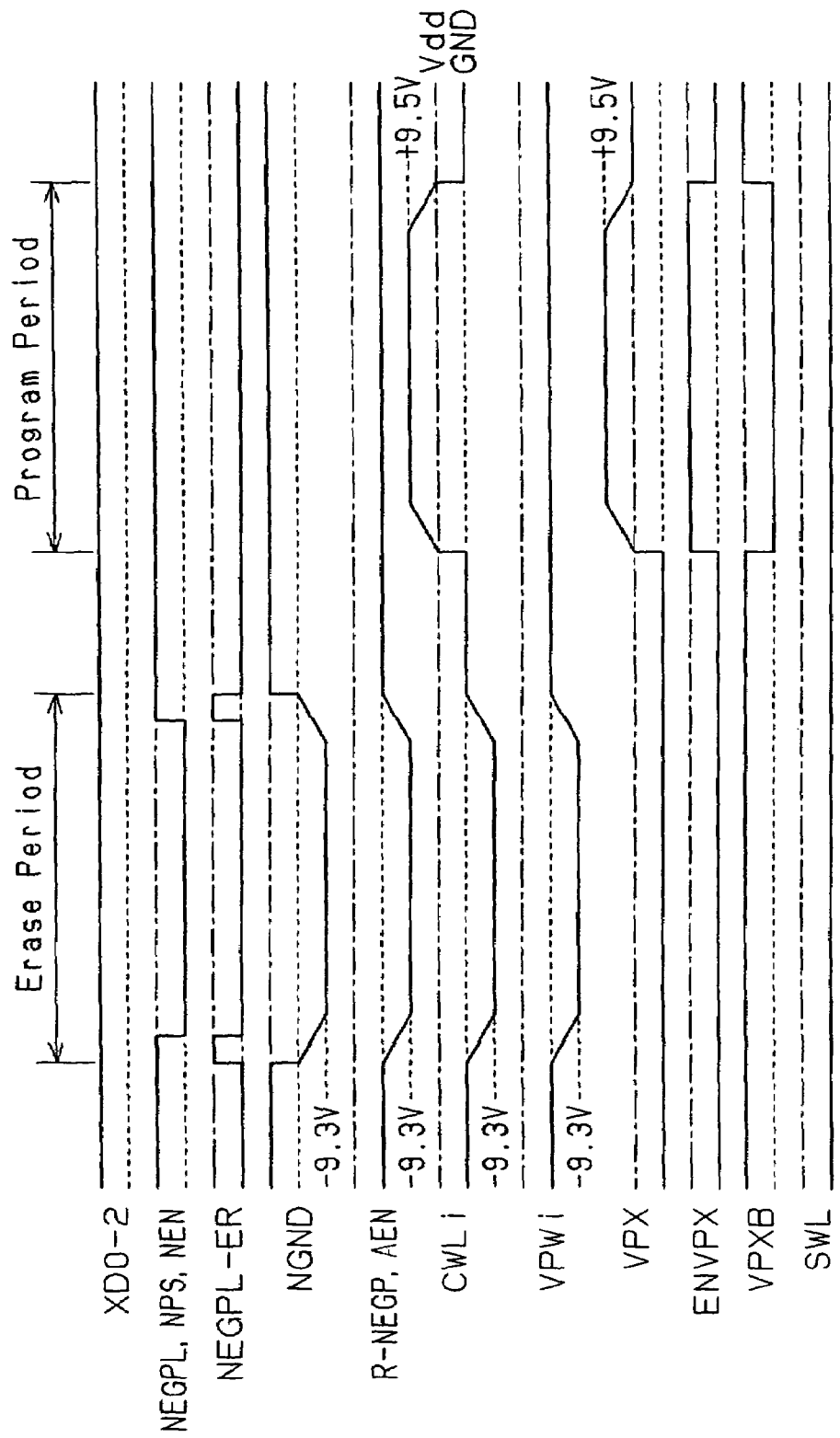

NON-VOLATILE MEMORY AND WRITE METHOD OF THE SAME

CROSS-REFERENCE TO RELATED APPLICATIONS

This application is a continuation of, and claims priority from International Patent Application No. PCT/JP03/016157, filed on Dec. 17, 2003, the entire contents being incorporated herein by reference.

BACKGROUND OF THE INVENTION

The present invention relates to a non-volatile memory and a write method of the same, and more specifically, to a flash memory that is electrically erasable/writable and a write method of the same.

Recently, in a semiconductor integrated circuit device (LSI) such as an ASIC, a logic combined flash memory is being widely used. The flash memory is a non-volatile memory, in which data is entirely erased and written electrically, and holds data even when there is no power since charges are maintained in an electrically separated region called a floating gate, which is embedded in a gate oxide film. There is a demand for shortening the erase/write time in such flash memory.

Writing to the flash memory consists of two operations, erasing and programming. Erasing is an operation for reducing a threshold value of a memory cell (cell transistor), programming is an operation for increasing the threshold value, and generally, the state in which the threshold value is low corresponds to data "1", and the state in which the threshold value is high corresponds to data "0". Normally, erasing performs total erasing in a memory unit having a certain size and referred to as a sector, and programming performs writing for each cell (bit) unit.

Conventionally, a flash memory (e.g., refer to Japanese Laid-Open Patent Publication No. 5-342892) in which erasing is performed in any single bit is known. In the configuration disclosed in Japanese Laid-Open Patent Publication No. 5-342892, a source line connected to each cell constituting the cell array is arranged separately from each other for each column unit cell. By applying high voltage to a source line externally specified by an address and applying a negative voltage to a word line, an arbitrary bit within the cell array is erased.

Other examples include a plurality of cells connected to the same word line that is erased in byte units (e.g., refer to Japanese Laid-Open Patent Publication No. 6-251594). In the configuration disclosed in Japanese Laid-Open Patent Publication No. 6-251594, the source line connected to each cell is arranged so as to be shared between adjacent cells in the column direction. In the same manner as in Japanese Laid-Open Patent Publication No. 5-342892, by applying high voltage to a source line externally specified by an address and applying negative voltage to the word line, a plurality of cells are entirely erased in byte units.

In Japanese Laid-Open Patent Publication Nos. 5-342892 and 6-251594, erasing of cells is performed by eliminating electrons from the floating gate using the FN (Fowler-Nordheim) tunnel current flowing between the source and floating gate. On the other hand, the programming is performed by injecting electrons (hot electrons) into the floating gate using the avalanche breakdown phenomenon.

However, hot electrons have a low generation efficiency, and, for example, the current flowing to the floating gate is only about a few pA with respect to the drain current of about 100 μA flowing during programming. Thus, a problem in which the current efficiency is low, and the current consumption increases during program occurs.

Recently, a method for injecting electrons into the floating gate using the FN tunnel current flowing between the channel-floating gate for programming in addition to erasing has been proposed in response to the demand for low power consumption (e.g., refer to Japanese Laid-Open Patent Publication No. 11-177068). In case of performing programming with the tunnel current, the current efficiency is improved by about three digits compared to when hot electrons are used.

SUMMARY OF THE INVENTION

However, in the prior art shown in Japanese Laid-Open Patent Publication Nos. 11-177068, 6-251594, and 11-177068, all of the cells connected to the same word line could not be entirely written (erased/programmed). It is to be noted that in the configuration disclosed in Japanese Laid-Open Patent Publication No. 11-177068, by changing the substrate (well) potential for every cell along the column direction of the cell array, an arbitrary cell connected to the same word line is selectively erasable/programmable. However, not all cells can be entirely written.

Consequently, since the band width in one write process (i.e., number of write bits per unit time) is small, a problem in which a long period of time is needed to complete write (erase/program) to all the cells on one word line arises.

In a first aspect of the present invention, a non-volatile memory including a word line, a plurality of memory cells connected to the word line, and a plurality of source lines each connected to one of the plurality of memory cells is provided. The non-volatile memory includes a plurality of source voltage supply circuits, connected to each source line, for retrieving write data from an associated one of the memory cells and supplying one of either a first source voltage or a second source voltage to the associated source line in accordance with the write data.

In a second aspect of the present invention, a write method of a non-volatile memory including a word line, a plurality of memory cells connected to the word line, and a plurality of source lines each connected to one of the plurality of memory cells is provided. The write method including a first step for supplying one of either a first source voltage or a second source voltage that is less than the first source voltage to the plurality of source lines in accordance with write data, a second step for supplying a first control voltage related to erasing to the word line after the first step, and a third step for supplying a second control voltage related to programming to the word line after the second step while maintaining the voltage supplied to each source line in the first step.

In a second aspect of the present invention, a write method of a non-volatile memory including a word line, a plurality of memory cells connected to the word line, and a plurality of source lines each connected to one of the plurality of memory cells is provided. The method includes a first step for supplying one of either a first source voltage or a second source voltage to the source line connected to each memory cell in accordance with write data, a second step for supplying a control voltage related to programming to the word line after the first step, and a third step for supplying a control voltage related to erasing to the word line after the second step while maintaining the voltage supplied to each source line in the first step.

BRIEF DESCRIPTION OF THE DRAWINGS

FIG. 2 is an explanatory diagram showing a write method of the non-volatile memory cell of the present embodiment;

FIG. 19 is an operation waveform chart of the word line driver of FIG. 18;

DETAILED DESCRIPTION OF THE PREFERRED EMBODIMENTS

Figure 1A:
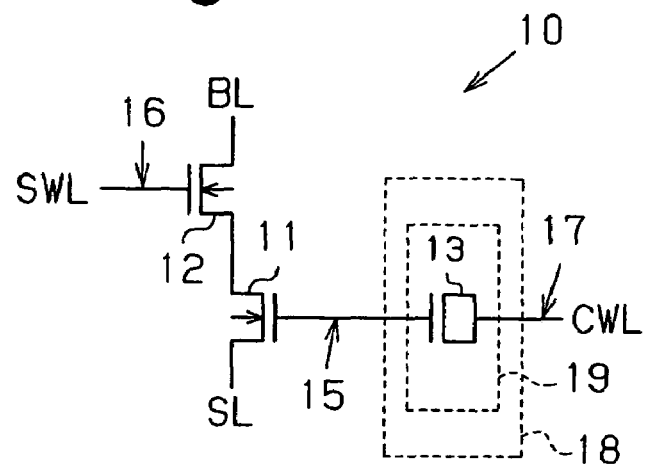
FIG. 1A is a schematic circuit diagram of a non-volatile memory cell according to one embodiment of the present invention.
Figure 1B:
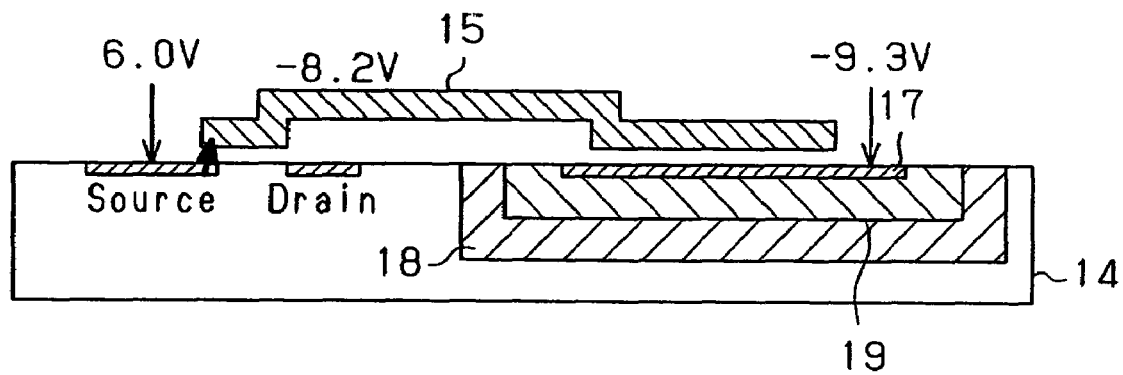
FIGS. 1B and 1C are schematic cross sectional views of the non-volatile memory cell of FIG. 1A.
Figure 1C:
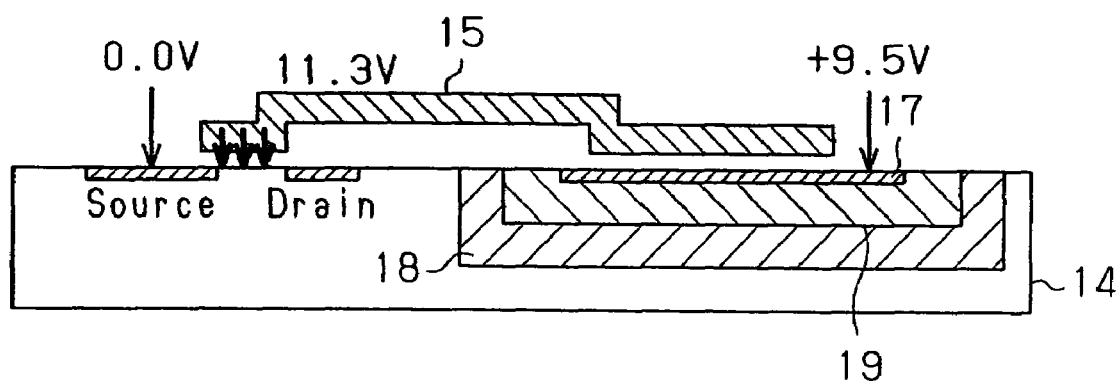

FIGS. 1A to 1C are explanatory diagrams showing a non-volatile memory cell 10 according to a first embodiment of the present invention. The non-volatile memory cell 10 is a flash memory cell having a single-layered polysilicon structure in the present embodiment and includes three elements of a memory transistor 11, a select transistor 12, and a MOS capacitor 13.

As shown in FIG. 1A to FIG. 1C, the memory transistor 11 is configured by, for example, an NMOS transistor in which a floating gate 15 serves as a gate on the P-type substrate 14. The source is connected to a source line SL.

The select transistor 12 is configured by an NMOS transistor (not shown in FIGS. 1B and 1C) in which a select gate 16 serves as a gate on the substrate 14. The source is connected to a bit line BL, and the select gate 16 is connected to a selection word line SWL. The drains of the memory transistor 11 and the select transistor 12 are connected to each other.

The MOS capacitor 13 is configured by forming an N-type diffusion layer serving as a control gate 17 in the substrate 14, and forming the floating gate 15 on the control gate 17 separated by an insulation layer. The control gate 17 is formed in a triple well (within P-well 19 formed in the N-well 18 in the drawing) of the substrate 14. The control gate 17 is connected to a control word line CWL. It is to be noted that in the memory cell 10 having a single-layered polysilicon structure in the present embodiment, when reference is made to a word line, this term would refer to the control word line CWL.

In such memory cell 10, in the present embodiment, it is assumed that writing is performed by having a state in which electrons are accumulated in the floating gate 15 (state of high threshold value) corresponds to data "0", and a state in which the electrons are not accumulated in the floating gate 15 (state of low threshold value) corresponds to data "1".

Writing to the memory cell 10 includes two operations, erasing and programming. Erasing is an operation for eliminating electrons from the floating gate 15 to lower the threshold value of the memory cell 10 (memory transistor 11). In other words, erasing is an operation for re-writing the data of the memory cell 10 from data "0" to data "1".

As shown in FIG. 1B, erasing is performed by applying a high voltage (e.g., 6.0 V) serving as a first source voltage to the source of the memory transistor 11 and applying a negative voltage (e.g., −9.3 V) serving as a first control voltage to the control gate 17. A P-well 19 is set to the same potential (e.g., −9.3 V) as the control gate 17, and N-well 18 to, for example, 6.0 V.

In this case, the potential of the floating gate 1 is pulled down to about −8.2 V due to capacitive coupling, and a high voltage of about 14.2V is applied between the source-floating gate 15. As a result, FN tunnel current (shown by an arrow in the figure) flows, and the electrons are eliminated from the floating gate 15, and the threshold value of the memory cell 10 (memory transistor 11) is lowered. Therefore, the memory cell 10 is re-written from data "0" to data "1".

On the other hand, programming is an operation for injecting electrons to the floating gate 15 to increase the threshold value of the memory cell 10 (memory transistor 11). In other words, programming is an operation for re-writing the data of the memory cell 10 from data "1" to data "0".

As shown in FIG. 1C, programming is performed by applying a ground voltage (0.0 V) serving as a second source voltage to the source of the memory transistor 11 and applying a high voltage (e.g., 9.5 V) serving as a second control voltage to the control gate 17. The P-well 19 is set to ground voltage (0.0 V), and the N-well 18 is set to, for example, 6.0 V.

In this case, the potential of the floating gate 15 is pulled up to about 11.3 V due to capacitive coupling, and a high voltage of about 11.3 V is applied between the source-floating gate 15. As a result, the FN tunnel current (shown by an arrow in the drawing) flows and the electrons are injected to the floating gate 15. This raises the threshold value of the memory cell 10 (memory transistor 11). Therefore, the memory cell 10 is re-written from data "1" to data "0".

Although the present embodiment is embodied in the memory cell 10 of a single-layered polysilicon structure, it may also be embodied in a memory cell of a double-layered polysilicon structure (a structure in which the floating gate is embedded in an electrically separated manner in the gate oxide film to stack the floating gate and the control gate, also known as a stack-type).

The memory cell 10 of a single-layered structure has a larger cell area compared to the memory cell of a double-layered structure (stack-type). However, the processing steps involving a single-layered polysilicon are reduced. Therefore, it is a suitable structure when used for small capacity memory application and if the percentage of the memory cell occupying the die size is small.

The principle of the write method of the memory cell 10 of the present embodiment will now be explained.

As shown in FIG. 2, the memory cell array 20 is formed by arranging arrays of a plurality of memory cells 10. The source of each memory cell 10 is separated from each other for every column unit cell, and respectively connected to the source line SL (SL0 to SL3 in the drawing). The control gate 17 of each memory cell 10 is connected to a common control word line CWL (CWL0, CWL1 in the drawing) for every row unit cell. In FIG. 2, the select transistor 12 is not shown.

In such memory cell array 20, writing data (erasing/programming) to the memory cell 10 is performed entirely to the row unit of the memory cell 10 connected to a selected one of the control word lines CWL.

The principle will now be explained. During writing, voltage corresponding to each piece of write data ("1" or "0") of each memory cell 10 is supplied to the source lines SL0 to SL3. Here, a case in which the first source voltage of high voltage (e.g., 6.0 V) corresponding to data "1" is supplied to the source lines SL1, SL3, and the second source voltage of ground voltage (0.0 V) corresponding to data "0" is supplied to source lines SL0, SL2 is assumed.

In this state, the first control voltage of negative voltage (e.g., −9.3 V) is supplied to a selected one of control word lines CWL (e.g., CWL0). The memory cell 10 in which the first source voltage corresponding to the write data "1" is applied to the source is erased as tunnel current flows and eliminates electrons from the floating gate 15 (refer to FIG. 1B). That is, the memory cell 10, in which the second source voltage corresponding to the write data "0" is applied to the source, is not erased.

The second control voltage of high voltage (e.g., 9.3 V) is then supplied to the control word line CWL0 while maintaining each voltage supplied to the source lines SL0 to SL3. The memory cell 10 in which the second source voltage corresponding to the write data "0" is applied to the source is programmed as tunnel current flows and injects electrons into the floating gate 15 (refer to FIG. 1C). That is, the memory cell 10 in which the first source voltage corresponding to the write data "1" is applied to the source is not programmed.

Therefore, in such method, writing (erasing/programming) is performed entirely to all of the memory cells 10 connected to the same control word line CWL0 based on the voltage supplied in advance to each source lines SL0 to SL3 in accordance with the write data ("1" or "0").

The configuration of the non-volatile memory of the present embodiment will now be explained in detail.

Figure 3:
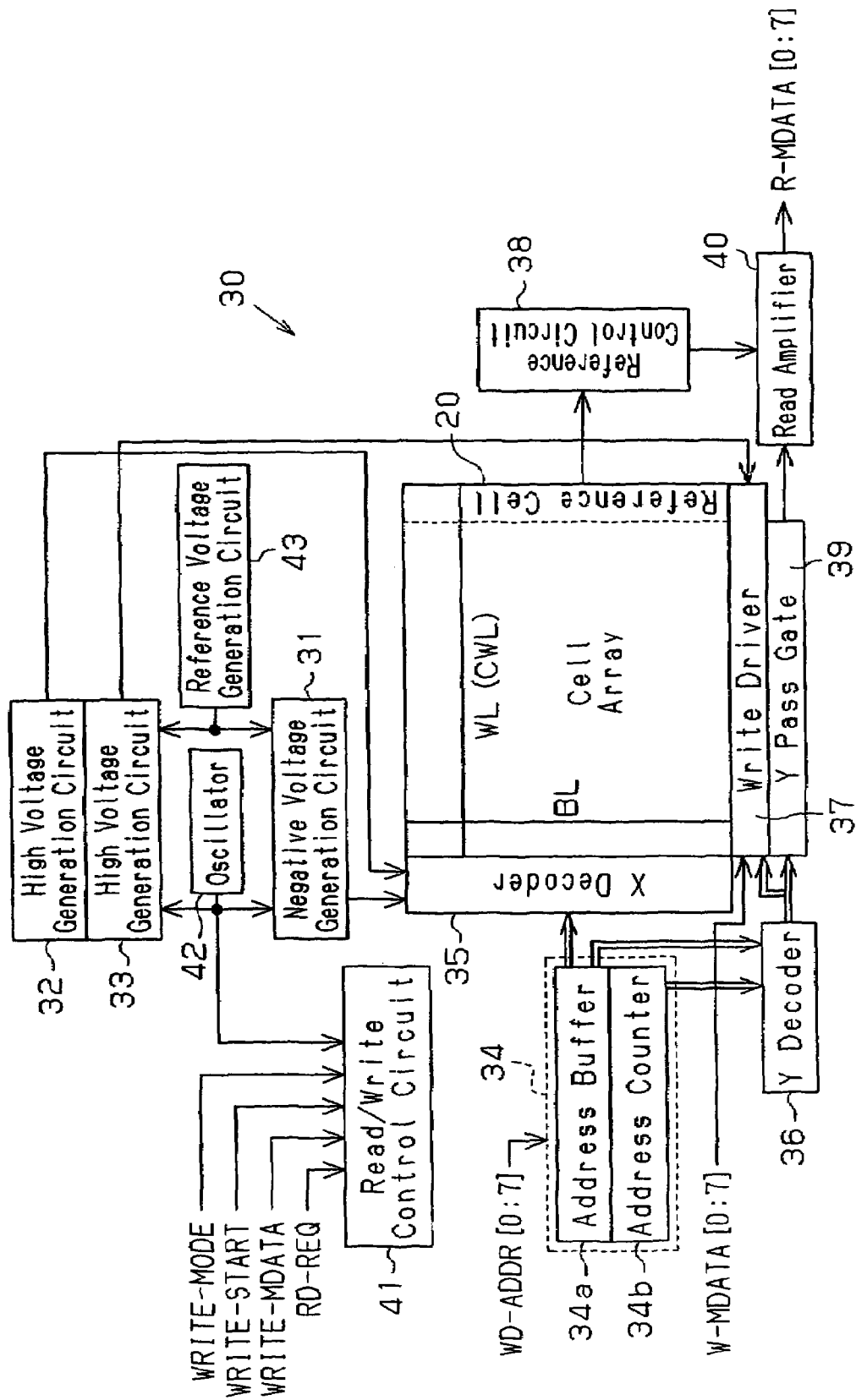
FIG. 3 is a schematic block diagram of the non-volatile memory cell of the present embodiment.
Figure 4:
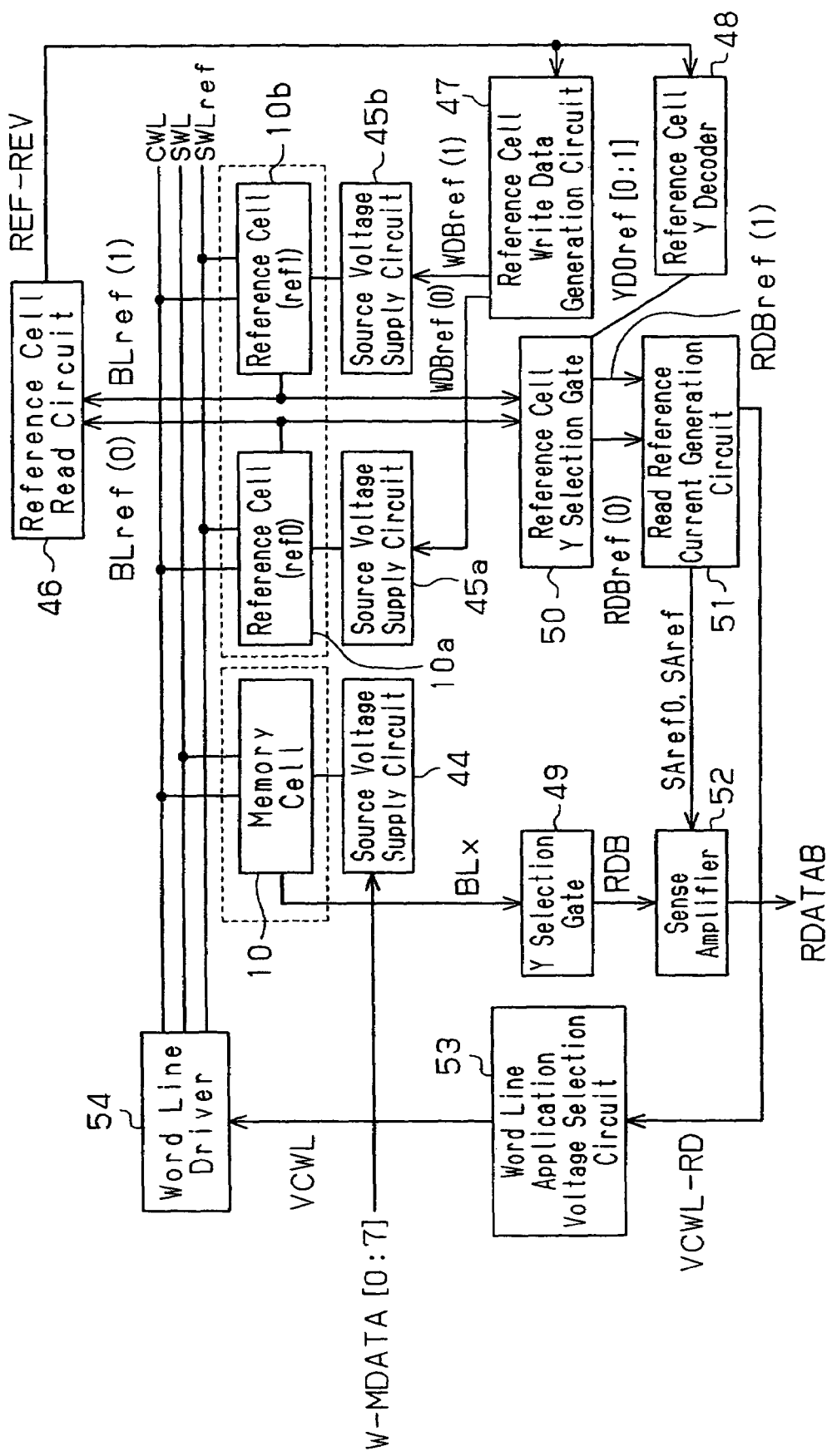
FIG. 4 is a detailed block diagram of the non-volatile memory of FIG. 3.

FIG. 3 is a block diagram showing the schematic configuration of a flash memory (non-volatile memory), and FIG. 4 is a block diagram showing the configuration of the same in detail. FIG. 4 shows part of the memory cell 10 connected to one control word line CWL.

The flash memory 30 includes a memory cell array 20, first to third voltage generation circuits 31 to 33, an address control circuit 34, an X decoder 35, a Y decoder 36, a write driver 37, a reference control circuit 38, a Y pass gate 39, a read amplifier 40, and a read/write control circuit 41.

In the memory cell array 20, array of a plurality of memory cells 10 and a pair of reference cells 10a, 10b (refer to FIG. 4) are respectively arranged for every row unit of cells. The reference cells 10a, 10b are cells for generating a current that acts as a reference for determination of read data when reading data from the memory cell 10.

The first voltage generation circuit 31 is a negative voltage generation circuit for generating and supplying to the X decoder 35, a negative voltage (e.g., −9.3 V in the present embodiment) serving as the first control voltage that is supplied to the control word line CWL. The second voltage generation circuit 32 is a high voltage generation circuit for generating and supplying to the X decoder 35, a high voltage (e.g., 9.5 V in the present embodiment) serving as the second control voltage that is be supplied to the control word line CWL.

The third voltage generation circuit 33 is a high voltage generation circuit for generating and supplying to the write driver 37, a high voltage (e.g., 6.0 V in the present embodiment) serving as the first source voltage that is supplied to the source line SL. The first to third voltage generation circuits 31 to 33 are driven by an oscillator 42 and generate each voltage based on the reference voltage supplied from the reference voltage generation circuit 43.

The address control circuit 34 includes an address buffer 34a and an address counter 34b. The address buffer 34a retrieves an externally provided write address WD-ADDR in a byte unit [0:7] and supplies it to the X decoder 35 and the Y decoder 36.

More specifically, the address buffer 34a provides the higher rank 5 bits of the write address WD-ADDR, which are used to select the control word line CWL during writing, to the X decoder 35 as a row address. The X decoder 35 then decodes the same and selects one of a plurality of control word lines CWL.

Further, the address buffer 34a provides the lower rank 3 bits of the write address WD-ADDR, which are used to select the source line SL during writing, to the Y decoder 36 as a column address. The Y decoder 36 then decodes the same, retrieves the write data at the corresponding source voltage supply circuits 44, 45a, 45b (refer to FIG. 4) in the write driver 37, which will be described hereinafter in more detail, and generates a decoded signal for setting the source voltage.

The address counter 34b generates an internal address of 3 bits for selecting the memory cell 10 corresponding to the read data R-MDATA [0:7] of 8 bits for every single bit. Therefore, the Y decoder 36 sequentially selects the memory cell 10 subject to reading based on the address output from the address counter 34b, and sequentially latches the read data of each of the single bit read out by the read amplifier 40 with a read data latch (8 bit), which is not shown.

The reference control circuit 38 includes a reference cell read circuit 46, a reference cell write data generation circuit 47, and a reference cell Y decoder 48. The reference cell read circuit 46 reads the data written to the two reference cells 10a, 10b, respectively, via bit lines BLref(0), BLref(1) connected thereto and determines the 10 polarity of each data.

More specifically, when writing data to the memory cell 10, data "0" and data "1" are written to the reference cells 10a, 10b, respectively, so as to have an inverted polarity with respect to each other. The reference cell read circuit 46 latches the data read from each reference cells 10a, 10b before writing data to the memory cell 10, determines which data "1" is written, and outputs the polarity signal REF-REV indicating the polarity.

The reference cell write data generation circuit 47 generates the reference cell write data WDBref(0), WDBref(1) based on the polarity signal REF-REV from the reference cell read circuit 46 so that data is written to each reference cell 10a, 10b with the polarity opposite from the presently written data.

Therefore, whenever writing data to the memory cell 10, data is written to the reference cells 10a, 10b so that the polarity is opposite from the present data. The data is inverted whenever data is written because the distribution of the threshold value of each reference cell 10a, 10b to generate the reference current is desired to be within a predetermined range.

The reference cell Y decoder 48 generates decoded signals YD0ref(0), YD0ref(1) in accordance with the data ("1" or "0") presently written to the reference cells 10a, 10b based on the polarity signal REF-REV from the reference cell read circuit 46.

The write driver 37 includes source voltage supply circuits 44, 45a, 45b corresponding to each of the source lines SL connected to each cell (memory cell 10, reference cells 10a, 10b) in the column direction. The source voltage supply circuits 44, 45a, 45b have substantially the same configuration.

More specifically, the source voltage supply circuit 44 corresponds to the source line SL connected to the memory cell 10 and retrieves the write data W-MDATA externally provided in byte unit [0:7] based on the decoded result of the address by the Y decoder 36. The first or second source voltage corresponding to the retrieved data ("0" or "1") is supplied to the source line SL.

The source voltage supply circuits 45a, 45b respectively correspond to the source line SL connected to the reference cells 10a, 10b and retrieves the reference cell write data WDBref(0), WDBref(1) (data having opposite polarity from each other) supplied from the reference cell write data generation circuit 47. The first or second source voltage respectively corresponding to the retrieved data ("0" or "1") is supplied to each source line SL.

The Y pass gate 39 includes a Y selection gate 49 and a reference cell Y selection gate 50. When reading data, the Y selection gate 49 selects a bit line BLx from a plurality of bit lines BL, and outputs the read signal RDB read from the memory cell 10 via the bit line BLx.

The reference cell Y selection gate 50 decodes each bit line BLref(0), BLref(1) based on the decoded signal YD0ref (0), YD0ref(1) from the reference cell Y decoder 48, and outputs the read signal RDBref(0) from the reference cell of data "0" and read signal RDBref(1) from the reference cell of data "1".

The read amplifier 40 includes a read reference current generation circuit 51 and a sense amplifier 52. The read reference current generation circuit 51 is input with the read signals RDBref(0), RDBref(1) output from the reference cell Y selection gate 50, and generates a first reference signal SAref0 serving as a read current (first reference current) of the reference cell of data "0" and a second reference signal SAref serving as a read current (second reference current) of the reference cell of data "1".

The sense amplifier 52 compares the read reference current, which is generated based on the first and second reference signals SAref0, SAref, and read current, which is generated based on the read signal RDB output from the Y selection gate 49. The sense amplifier 52 then determines whether the data of the memory cell 10 is "1" or "0" based on the comparison result, and outputs the read data RDATAB.

The X decoder 35 includes a word line application voltage selection circuit 53 and a word line driver 54. The word line application voltage selection circuit 53 selects and outputs the application voltage VCWL to be supplied to the control word line CWL. More specifically, the word line application voltage selection circuit 53 selects the first control voltage of negative voltage supplied from the first voltage generation circuit 31 when erasing data, and selects the read voltage VCWL-RD supplied from the read reference current generation circuit 51 and supplies it to the word line driver 54 when reading data.

When writing data, the word line driver 54 selects one control word line CWL based on the decoded result of the write address WD-ADDR with the Y decoder 36. The word line driver 54 supplies the first control voltage of negative voltage when erasing data, supplies the second control voltage of high voltage generated by the second voltage generation circuit 32 during programming, and supplies the read voltage VCWL-RD when reading data.

Further, when reading data, the word line driver 54 selects one selection word line SWL connected to the memory cell 10 subject to reading and one reference cell selection word line SWLref connected to the reference cells 10a, 10b for data determination based on the decoded result of the read address, which is not shown.

Writing/reading data to or from the memory cell 10 and the reference cells 10a, 10b is controlled by the read/write control circuit 41. More specifically, when writing data, the read/write control circuit 41 is shifted to the write operation in response to the write mode signal WRITE-MODE and starts to retrieve write data W-MDATA in response to the data transfer signal WRITE-MDATA.

After all the data of the memory cell 10 subject to writing is retrieved, writing starts entirely for the memory cell 10 connected to the same control word line CWL in response to the write start signal WRITE-START.

When reading data, the read/write control circuit 41 starts reading data in response to the read request signal RD-REQ. The read data R-MDATA read from the memory cell 10 subject to read is output from the read amplifier 40 in byte unit [0:7].

Details of each circuit will now be described.

Figure 5:
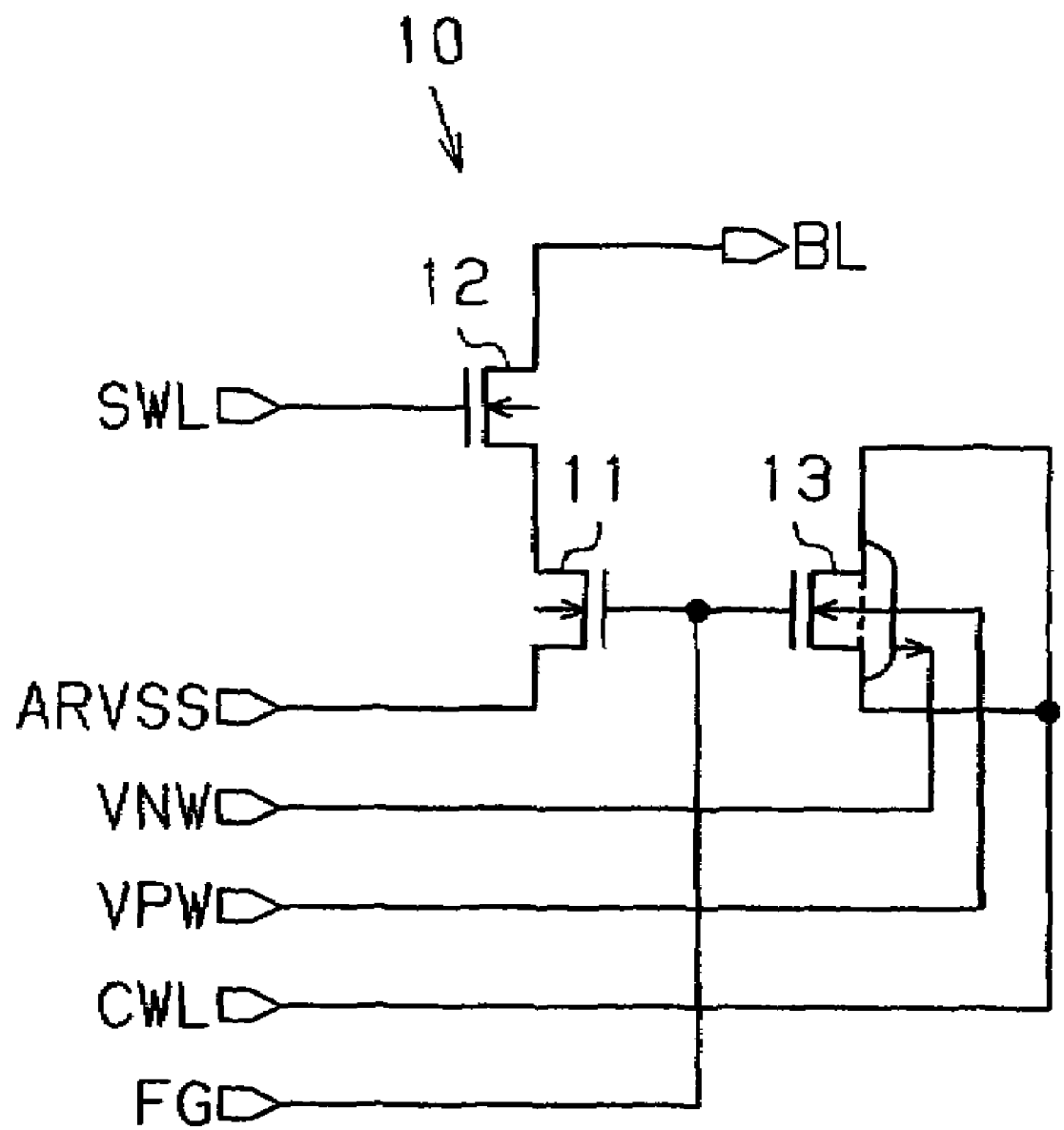
FIG. 5 is a detailed circuit diagram of the memory cell of the present embodiment.

FIG. 5 is a circuit diagram of the memory cell 10. Parts similar to those in FIG. 1A to FIG. 1C will not be described. Reference cells 10a, 10b have a configuration similar to the memory cell 10.

The source voltage ARVSS corresponding to write/read, respectively, are supplied from the source voltage supply circuit 44 via the source line SL to the source of the memory cell 10 (memory transistor 11).

The floating gate potential FG is set to approximately 3.0 V when the data is "1" and approximately 0.0 V when data is "0" in accordance with the data written to the memory cell 10. The N-well potential VNW is set to, for example, 6.0 V during writing. The P-well potential VPW is set to the same potential as the control gate when erasing data and to the ground potential during programming.

Figure 6:
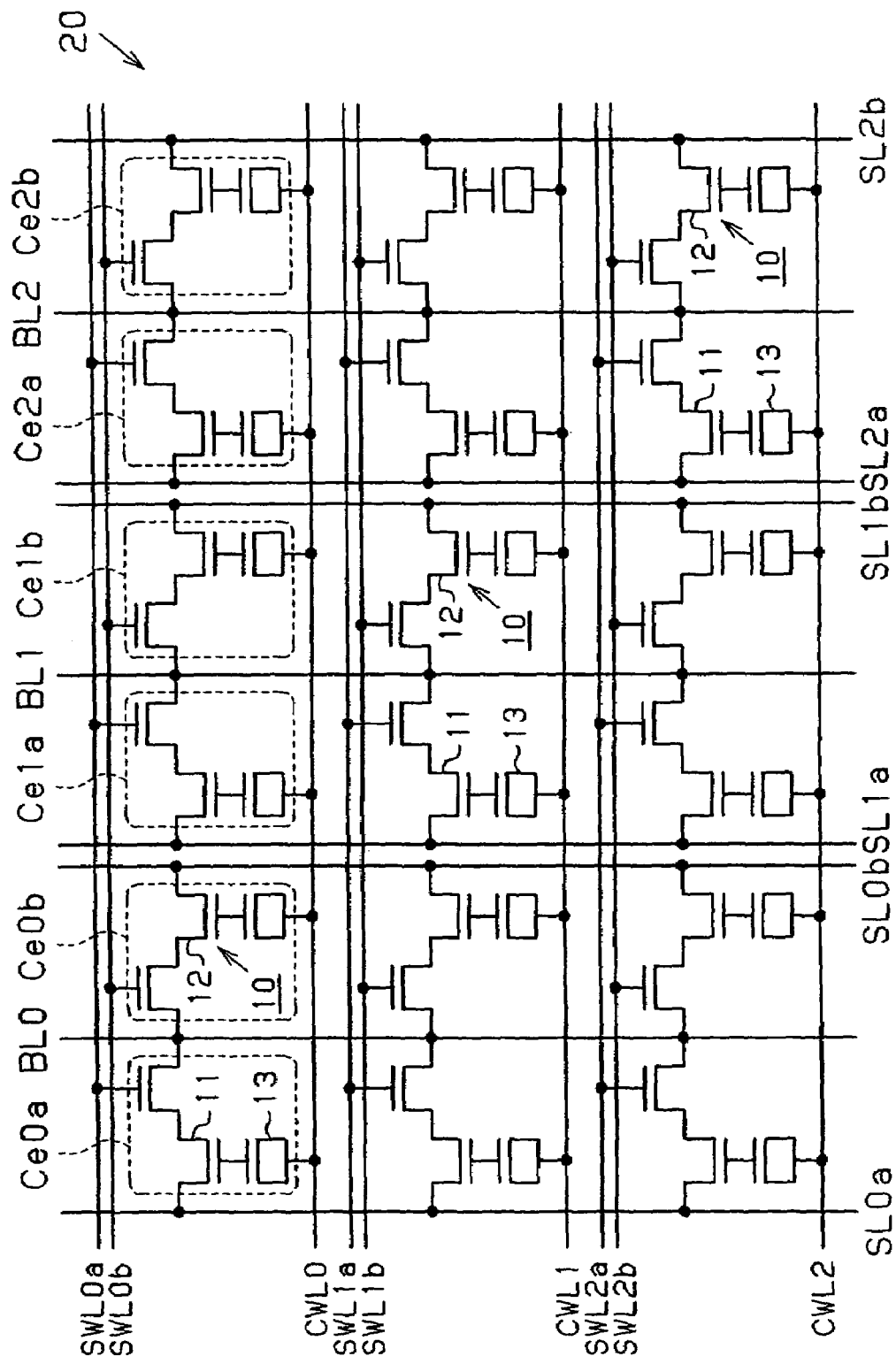
FIG. 6 is a circuit diagram showing a memory cell array of the present embodiment.

FIG. 6 is a circuit diagram showing one example of a configuration of the memory cell array 20. The memory cell array 20 includes memory cells 10 arranged in an array.

In the present embodiment, the bit line BL (BL0, BL1, BL2 in the figure) is shared between two adjacent memory cells 10 (Ce0a, Ce0b, Ce1a, Ce1b, Ce2a, Ce2b in the drawing) along the column direction. Each memory cell 10 has the source line SL (SL0a to SL2a, SL0b to SL2b in the drawing) separated from each other for every column unit and connected to the same control word line CWL (CWL0 to CWL2 in the drawing) for every row unit.

For every row unit of the memory cell 10, in each pair of cells that share the same bit line BL, one cell (cell on the side of Ce0a, Ce1a, Ce2a in the drawing) is connected to a selection word line SWL (SWL0a to SWL2a in the drawing) serving as the first selection word line. The other cell (cell on the side of Ce0b, Ce1b, Ce2b in the drawing) is connected to a selection word line SWL (SWL0b to SWL2b in the drawing) serving as the second selection word line.

Although not shown in FIG. 6, a pair of reference cells 10a, 10b is arranged in the memory cell array 20 for each control word line CWL (CWL0 to CWL2).

Figure 7:
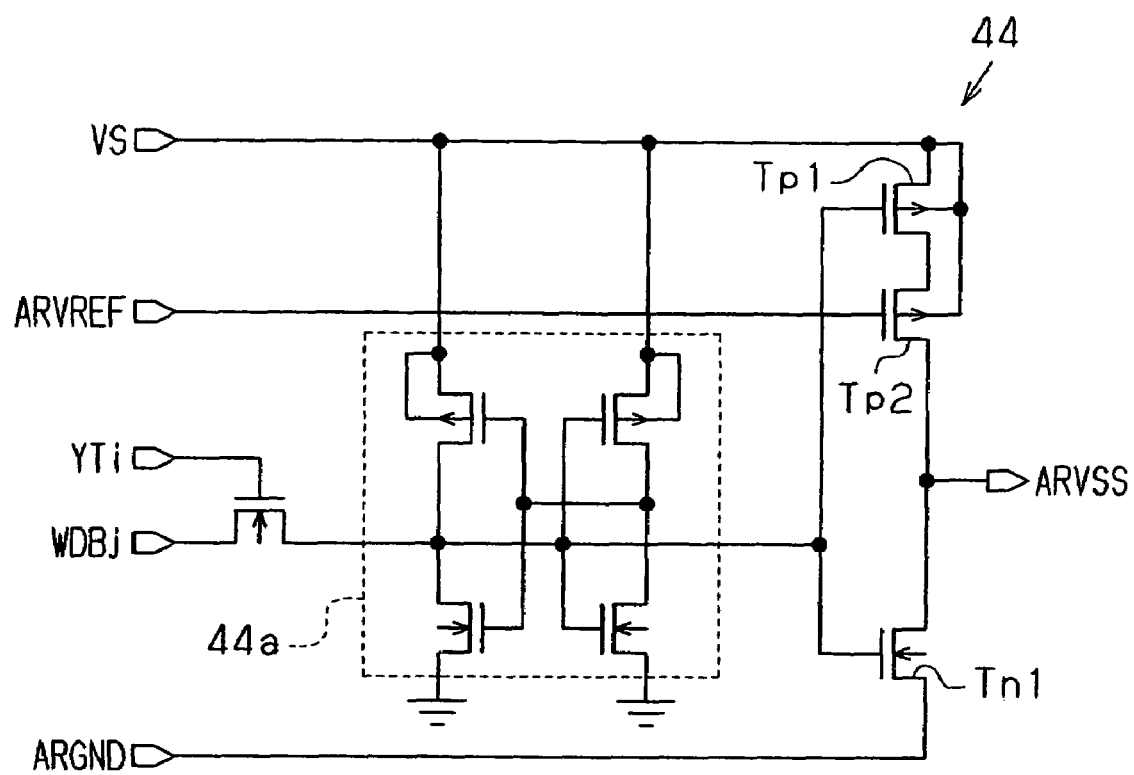
FIG. 7 is a circuit diagram of a source voltage supply circuit shown in FIG. 4.

FIG. 7 is a circuit diagram showing one example of a configuration of the source voltage supply circuit 44. The source voltage supply circuits 45a, 45b arranged in correspondence to the reference cells 10a, 10b also have substantially the same configuration as the source voltage supply circuit 44.

The source voltage supply circuit 44 includes a latch circuit 44a, retrieves the data WDBj, which is inverted from the externally supplied write data W-MDATA based on the decoded signal YTi from the Y decoder 36 that is decoded from the write address WD-ADDR, and latches the data with the latch circuit 44a.

The output signal of the latch circuit 44a is input to the gates of the transistor Tp1 (PMOS transistor) and the transistor Tn1 (NMOS transistor). The source of the transistor Tp1 is connected to the power source VS, and the source of the transistor Tn1 is connected to the ground power source ARGND.

A transistor Tp2 (PMOS transistor) is interposed in series between the transistors Tp1, Tn1, and the reference voltage ARVREF is input to the gate of the transistor Tp2. The source voltage ARVSS is output from the connection node of the transistors Tp2, Tn1.

The power source VS is set to, for example, 3.0 V during inputting the data WDBj to the latch circuit 44a, and set to the first source voltage of high voltage (e.g., 6.0V) generated by the third voltage generation circuit during writing (after latching of data WDBj). The transistor Tp2 controls the amount of current flowing to the memory cell 10 during writing based on the reference voltage ARVREF.

In this configuration, the source voltage supply circuit 44 supplies the source voltage ARVSS corresponding to the data WDBj (inverted signal) retrieved in the latch circuit 44a. That is, when the retrieved data WDBj is data "0", the first source voltage (power source VS in the drawing) of high voltage is supplied, and when the data WDBj is data "1", the second source voltage (ground power source ARGND in the drawing) of ground voltage is supplied.

Figure 8:
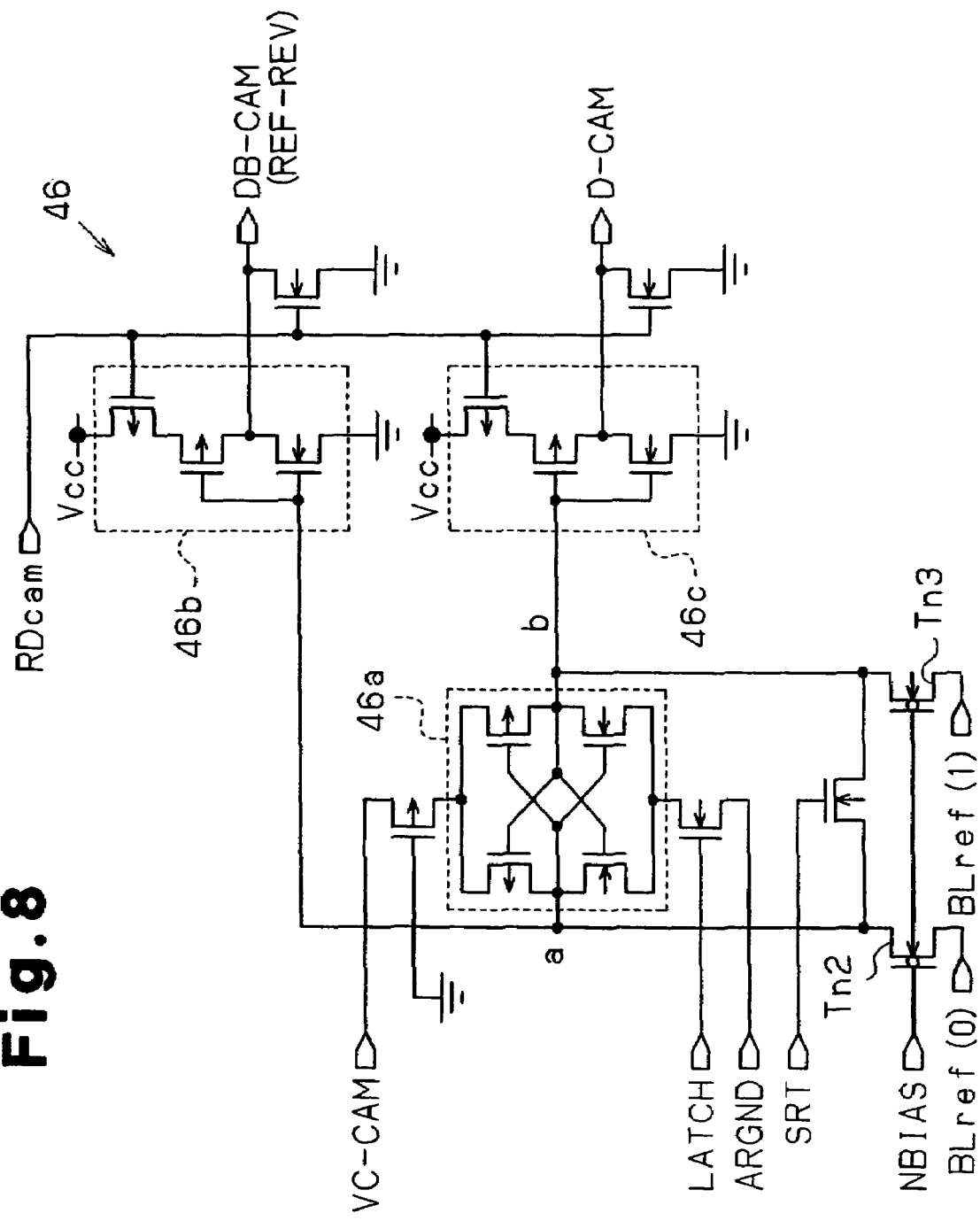
FIG. 8 is a circuit diagram of a reference cell read circuit shown in FIG. 4.
Figure 9:
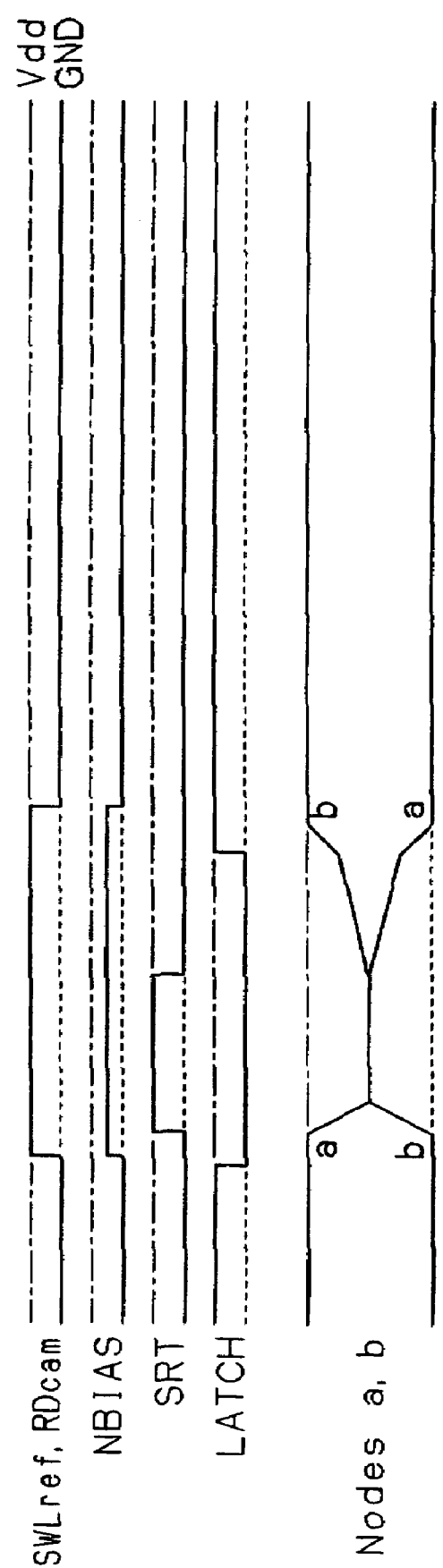
FIG. 9 is an operation waveform chart of the reference cell read circuit of FIG. 8.

FIG. 8 is a circuit diagram showing one example of a configuration of the reference cell read circuit 46, and FIG. 9 is an operation waveform chart of the same. The reference cell read circuit 46 includes a latch circuit 46a and data output circuits 46b, 46c.

One node a of the latch circuit 46a is connected to the bit line BLref(0) through the transistor Tn2 (NMOS transistor) and to the data output circuit 46b. Further, the other node b of the latch circuit 46a is connected to the bit line BLref(1) through the transistor Tn3 (NMOS transistor) and to the data output circuit 46c.

Each of the transistors Tn2, Tn3 are configured with a transistor having a low threshold value and their gates are supplied with a bias signal NBIAS during reading from the reference cells 10a, 10b. (The transistor in which a similar threshold value is set is shown in the same manner in the drawing).

The power source VC-CAM and the ground power source ARGND are supplied to the latch circuit 46a. The latch circuit 46a latches the potential of nodes a, b, that is, the complementary read data read from each reference cell 10a, 10b based on the latch signal LATCH when reading data.

The read operation will now be described in detail. The reference cell read circuit 46 first releases the latch state of the latch circuit 46a in accordance with the latch signal LATCH, as shown in FIG. 9. Next, the selection word line SWLref (refer to FIG. 4) connected to the reference cells 10a, 10b is selected (activated) and at the same time, the data output circuits 46b, 46c are inactivated based on the control signal RDcam.

Subsequently, after equalizing (equal potential) the nodes a, b based on the short signal SRT for short-circuiting the respective drain of the transistors Tn2, Tn3, by releasing the same, the read data of each reference cell 10a, 10b is amplified. That is, a potential difference is gradually produced between the nodes a, b by the read current of each reference cell 10a, 10b flowing to each bit line BLref(0), BLref(1).

Thereafter, the read data of each reference cell 10a, 10b latched to the latch circuit 46a by the latch signal LATCH is output from the data output circuits 46b, 46c as determination signals DB-CAM (polarity signal REF-REV) and D-CAM, respectively, based on the control signal RDcam.

The reference cell read circuit 46 reads the data of each reference cell 10a, 10b before writing data to the memory cell 10. This is to invert and write the data of each reference cell 10a, 10b whenever writing data to the memory cell 10.

Figure 10:
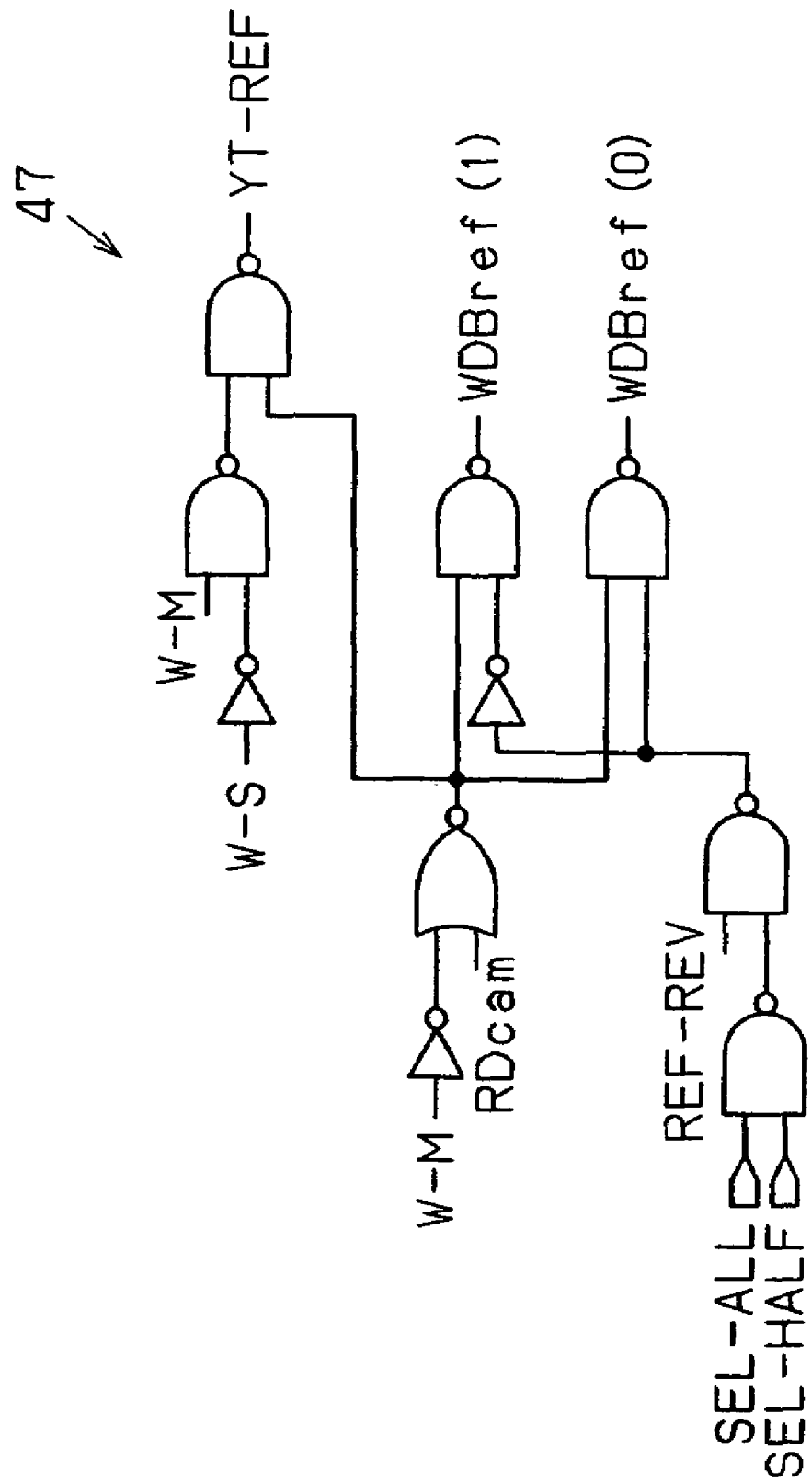
FIG. 10 is a circuit diagram of a reference cell write data generation circuit shown in FIG. 4.

FIG. 10 is a circuit diagram showing one example of a configuration of the reference cell write data generation circuit 47.

When writing data to the memory cell 10, the reference cell write data generation circuit 47 generates the reference cell write data WDBref(0), WDBref(1) based on the polarity signal REF-REV so as to have an opposite polarity with the data presently written to each reference cell 10a, 10b in response to the control signal W-M.

Further, the generation circuit 47 generates the decoded signal YT-REF in response to the control signal W-S, and outputs the decoded signal YT-REF to the source voltage supply circuits 45a, 45b. Therefore, when writing data, data having polarity opposite to the data presently written on the reference cells 10a, 10b is retrieved in each source voltage supply circuit 45a, 45b.

Figure 11:
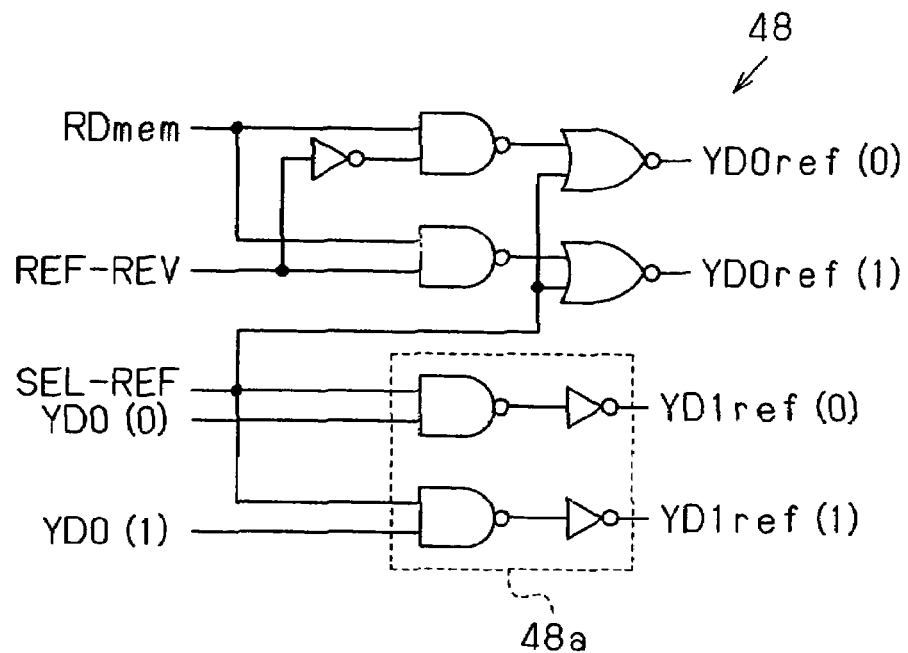
FIG. 11 is a circuit diagram of a reference cell Y decoder shown in FIG. 4.

FIG. 11 is a circuit diagram showing one example of a configuration of the reference cell Y decoder 48. In response to the control signal RDmem that becomes active during reading, the reference cell Y decoder 48 generates the decoded signals YD0ref(0) and YD0ref(1) based on the polarity signal REF-REV (present data of each reference cell 10a, 10b) and provides the signals to the reference cell Y selection gate 50.

A circuit 48a shown by broken lines in FIG. 11 is arranged to correspond to the test mode for testing the read current of the reference cell 10a, 10b, and the switching between the test mode and the normal node (normal reading) is carried out based on the control signal SEL-REF. During the test mode, the decoded signals YD1ref(0), YD1ref(1) are generated based on the externally provided input signals YD0(0), YD0(1).

Figure 12:
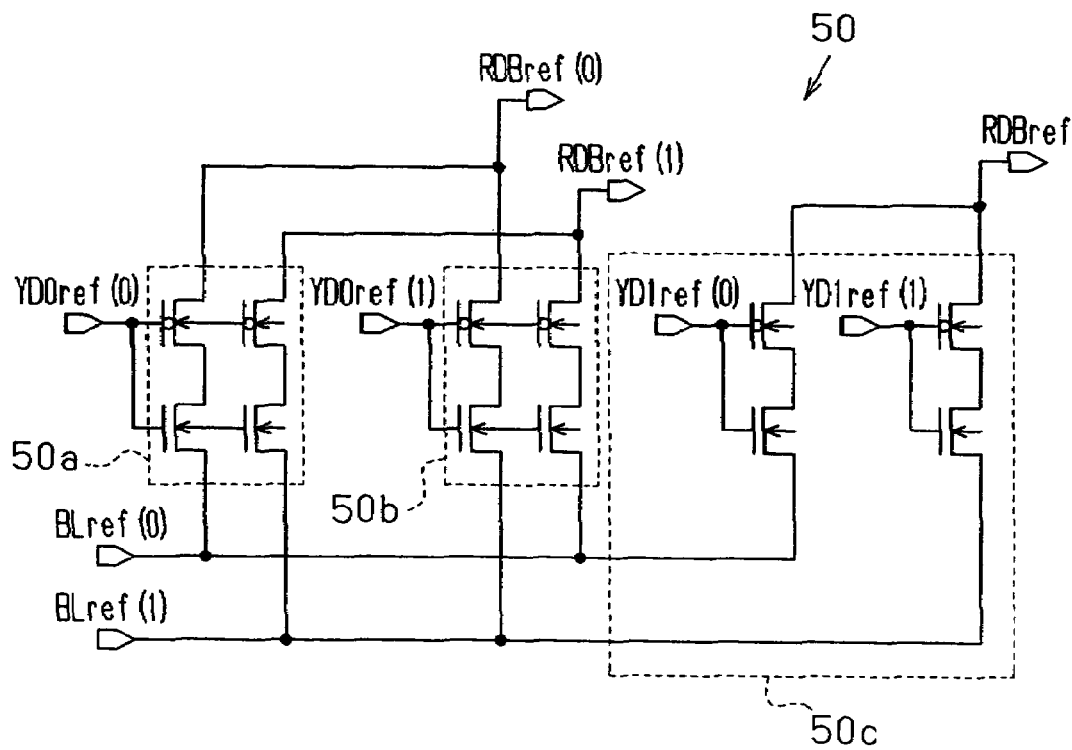
FIG. 12 is a circuit diagram of a reference cell Y selection gate shown in FIG. 4.

FIG. 12 is a circuit diagram showing one example of a configuration of a reference cell Y selection gate 50. The reference cell Y selection gate 50 includes selection circuits 50a, 50b, decodes each bit line BLref(0), BLref(1) based on the decoded signals YD0ref(0), YD0ref(1) from the reference cell Y decoder 48, and outputs the read signal RDBref(0) of data "0" and the read signal RDBref(1) of data "1".

A circuit 50c shown by broken lines in FIG. 12 is arranged to correspond to the test mode, and outputs the read signal RDBref of one of either the reference cell 10a or 10b based on the decoded signal YD1ref(0), YD1ref(1) provided from the reference cell Y decoder 48 during the test mode.

Figure 13:
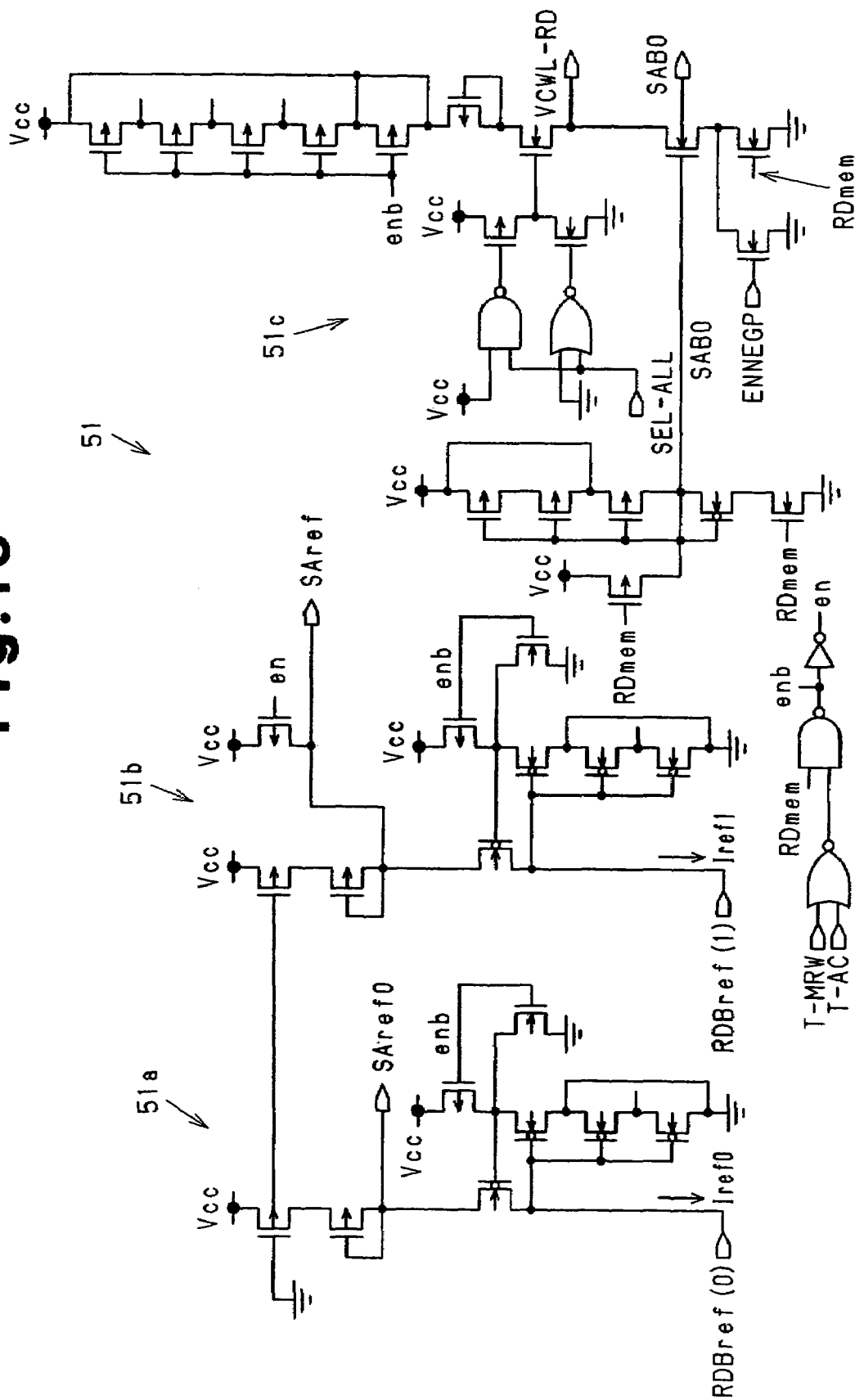
FIG. 13 is a circuit diagram of a read reference current generation current shown in FIG. 4.

FIG. 13 is a circuit diagram showing one example of a configuration of the read reference current generation circuit 51. The read reference current generation circuit 51 includes first and second reference current generation sections 51a, 51b and a read voltage generation section 51c.

The first reference current generation section 51a generates a first reference signal SAref0 having a value of a first reference current Iref0 based on the read signal RDBref(0) of the reference cell of data "0" output from the reference cell Y selection gate 50. The second reference current generation section 51b generates a second reference signal SAref having a value of a second reference current Iref1 based on the read signal RDFref(1) of the reference cell of data "1" output from the reference cell Y selection gate 50.

The read voltage generation section 51c is a circuit for generating a read voltage VCWL-RD supplied to the control word line CWL when reading data. The read voltage generation section 51c controls the read voltage VCWL-RD at the floating potential during program. The first and second reference current generation sections 51a, 51b and the read voltage generation section 51c are in an inactive state based on various test signals T-MRW, T-AC during the test mode.

Figure 14:
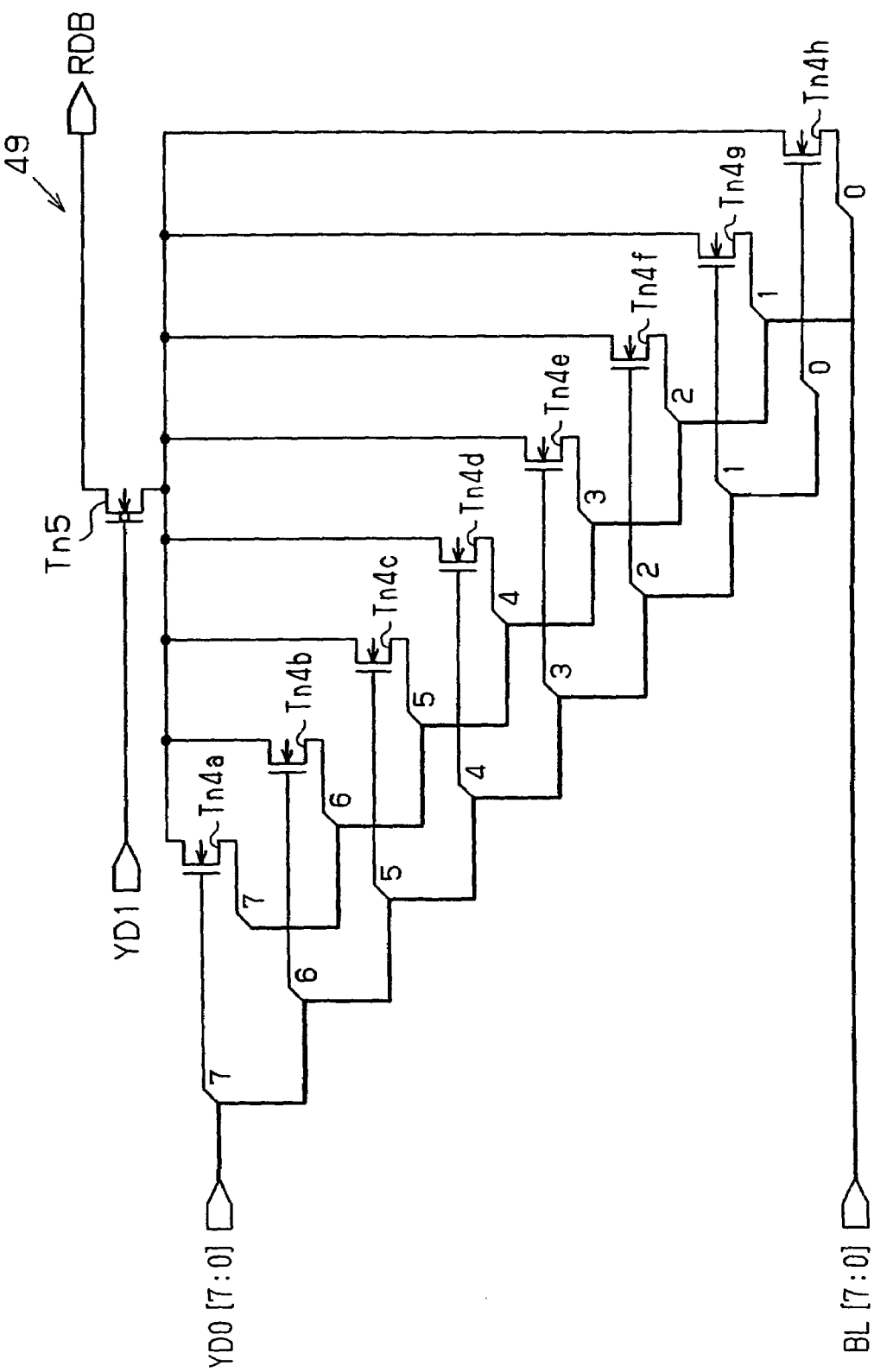
FIG. 14 is a circuit diagram of a Y selection gate shown in FIG. 4.

FIG. 14 is a circuit diagram showing one example of a configuration of the Y selection gate 49. The Y selection gate 49 is, in the present embodiment, connected to the bit line BL of 8 bits, and outputs the read signal RDB read from the memory cell 10 via one of the bit lines BL based on the decoded signal YD0 [7:0], YD1 decoded from the read address, which is not shown.

More specifically, the Y selection gate 49 includes eight transistors Tn4a to Tn4h, which are used for bit selection, and one transistor Tn5, which is used for byte selection (all of which are NMOS transistor). The Y selection gate 49 outputs the read signal RDB via one of the transistor Tn4a to Tn4h and the transistor Tn5 based on the decoded signals YD0[7:0] and YD1.

Figure 15:
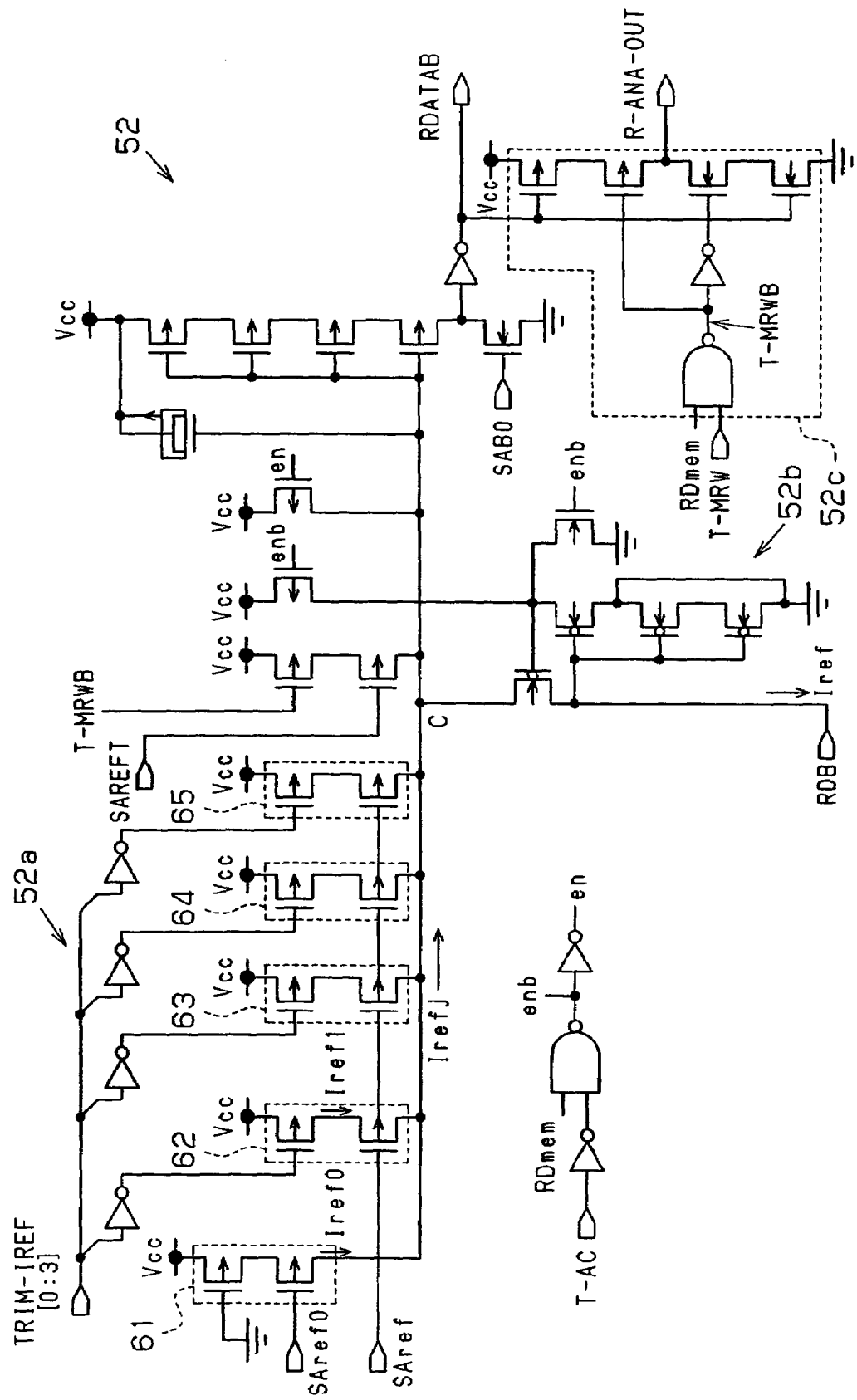
FIG. 15 is a circuit diagram of a sense amplifier shown in FIG. 4.

FIG. 15 is a circuit diagram showing one example of a configuration of a sense amplifier 52. The sense amplifier 52 includes a read reference current generation section 52a for generating a read reference current Irefj based on the first and second reference signals SAref0, SAref from the read reference current generation circuit 51, and a read current generation section 52b for generating a read current Iref based on the read signal RDB from the Y selection gate 49. More specifically, the read reference current generation section 52a includes a constant current section 61 and first to fourth constant current sections 62 to 65 and generates a first reference current Iref0 based on the first reference signal SAref0 input to the constant current section 61.

The first to the fourth constant current sections 62 to 65 have transistors with different sizes. The driving capacity of the second constant current section 63 is two times, the third constant current section 64 is four times, and the fourth constant current section 65 is eight times greater than the driving capacity of the first constant current section 62.

The read reference current generation section 52a drives at least one of the first to the fourth constant current sections 62 to 65 with a selection signal TRIM-IREF, and based on the second reference signal SAref input to the read reference current generation section 52a, generates the current of the second reference current Iref1 multiplied by a constant number $j (0<j<1)$. Therefore, the read reference current generation section 52a generates the read reference current IRefj as a total current of "first reference current Iref0 + second reference current Iref1 × constant number j".

The sense amplifier 52 compares the read reference current Irefj flowing to node c and the read current Iref flowing from the node c to determine whether the data of the memory cell 10 subject to reading is "1" or "0". That is, data determination is made by detecting the potential (H level or L level) of the node c that shifts in accordance with the read current IRef of the memory cell 10 flowing out from the node c, and the read data RDATAB indicating the determination result is output.

The circuit 52c shown by broken lines in FIG. 15 is arranged to correspond to the test mode, and externally outputs the read data RDATAB as the read signal R-ANA-OUT during the test mode.

Figure 16:
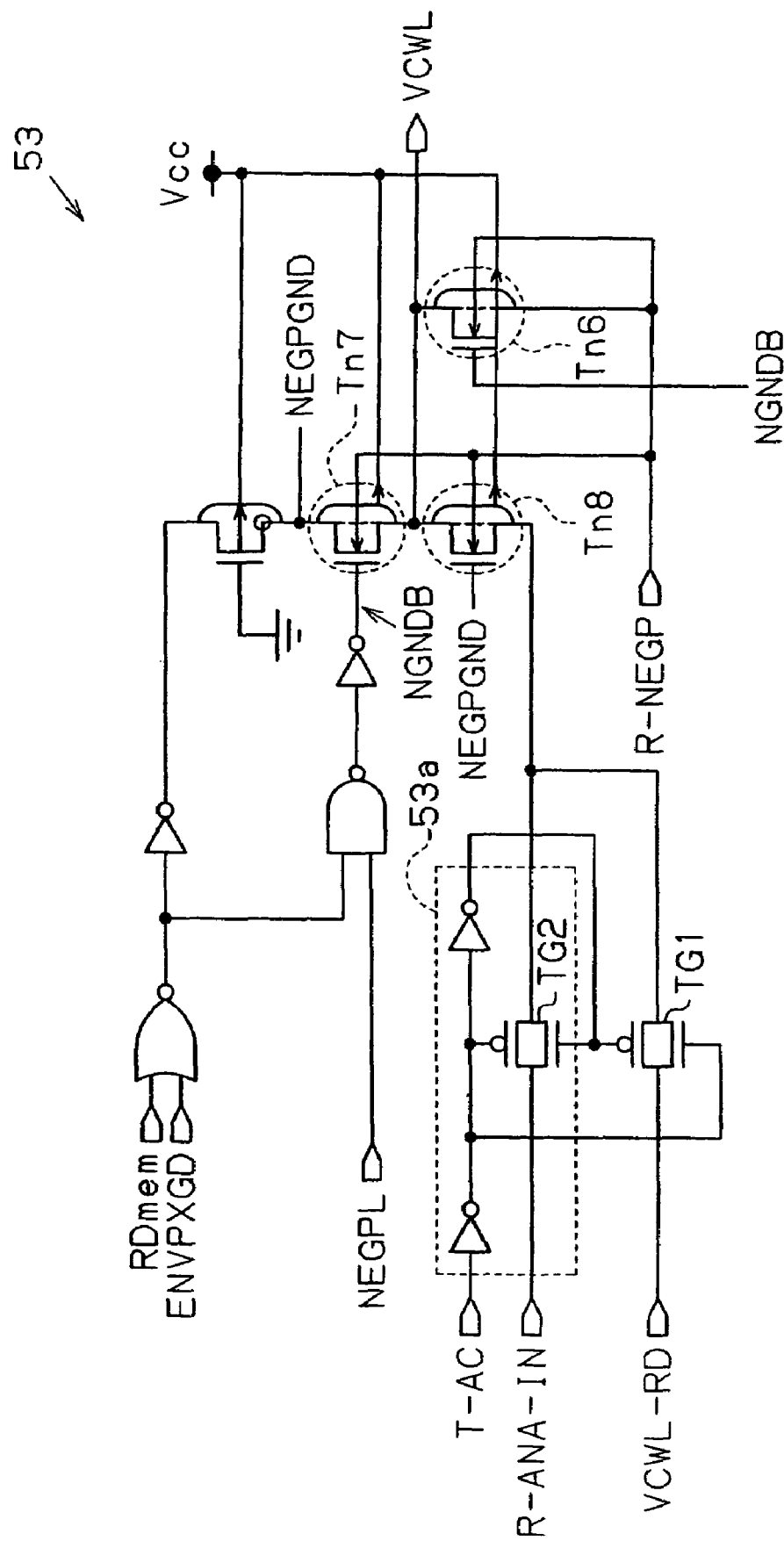
FIG. 16 is a circuit diagram of a word line application voltage selection circuit shown in FIG. 4.
Figure 17:
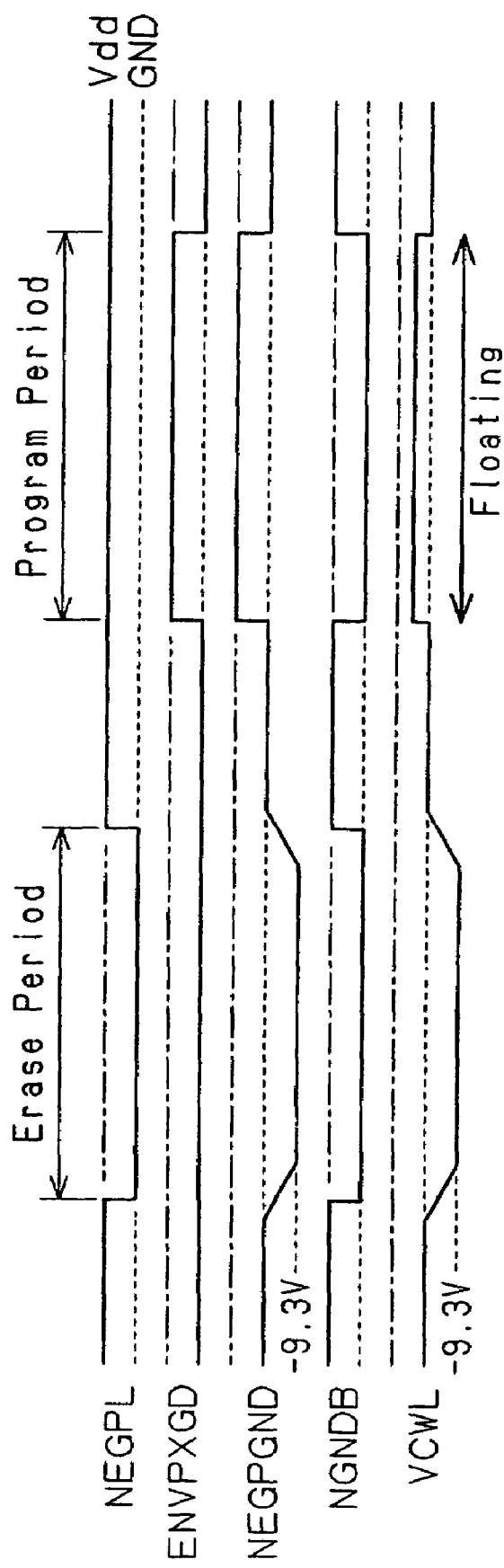
FIG. 17 is an operation waveform chart of the word line application voltage selection circuit of FIG. 16.

FIG. 16 is a circuit diagram showing an example of a configuration of a word line application voltage selection circuit 53, and FIG. 17 is an operation waveform chart of the same.

When erasing data, the first control voltage R-NEGP of negative voltage (−9.3 V) is supplied from the first voltage generation circuit 31 to the source and the back gate (P-well) of the transistor Tn6 (NMOS transistor) and the back gates (P-well) of the transistors Tn7, Tn8 (NMOS transistor).

The control signal NGNDB is provided to the gates of the transistor Tn6, Tn7. The control signal NGNDB is generated based on a plurality of control signals RDmem, ENVPXGD, NEGPL. The control signal RDmem is a signal that becomes an H level during reading, the control signal ENVPXGD is a signal that becomes an H level during programming, and the control signal NEGPL is a signal that becomes an L level when the first control voltage R-NEGP becomes lower than or equal to a predetermined voltage (e.g., −3.0V) when erasing data.

Therefore, when erasing data, the control signal NGNDB becomes an L level (more specifically, ground voltage), and the transistors Tn6, Tn7 are turned on based on the supply of the first control voltage R-NEGP.

The drain potential of the transistor Tn7, that is, the control signal NEGPGND becomes substantially the same as the first control voltage R-NEGP of negative voltage, and the transistor Tn8 is turned off by such control signal NEGPGND. Thus, when erasing data, the word line application voltage selection circuit 53 outputs the first control voltage R-NEGP of negative voltage (−9.3V) as the application voltage VCWL.

Since the control signal NGNDB input to the gate of the transistor Tn6 is the ground voltage, high voltage that exceeds the breakdown voltage is not applied to the source-gate of the transistor Tn6.

During programming, the control signal NGNDB becomes an L level (ground voltage) based on the H level control signal ENVPXGD. The first control voltage R-NEGP becomes 0V, and the transistors Tn6, Tn7 are turned off.

Further, since the control signal NEGPGND becomes H level, the transistor Tn8 is turned on. At this time, the read voltage VCWL-RD is controlled so as to be in the floating state by the read reference current generation circuit 51, and the application voltage VCWL becomes the floating potential (e.g., about 2.5V), as shown in FIG. 17.

When reading data, in the same manner, the control signal NGNDB becomes the ground voltage based on the control signal RDmem, and in the same manner as during program, the transistors Tn6, Tn7 are turned off, and the transistor Tn8 is turned on. Thus, during reading, the word line application voltage selection circuit 53 outputs the read voltage VCWL-RD supplied from the read reference current generation circuit 51 as the application voltage VCWL.

A circuit 53a shown by broken lines in FIG. 16 is arranged so as to correspond to the test mode for measuring the read current, and during such test mode, the transfer gate TG1 is turned off and the transfer gate TG2 is turned on based on the test signal T-AC. The test input signal R-ANA-IN is externally input, and the input signal R-ANA-IN is output as the application voltage VCWL.

Figure 18:
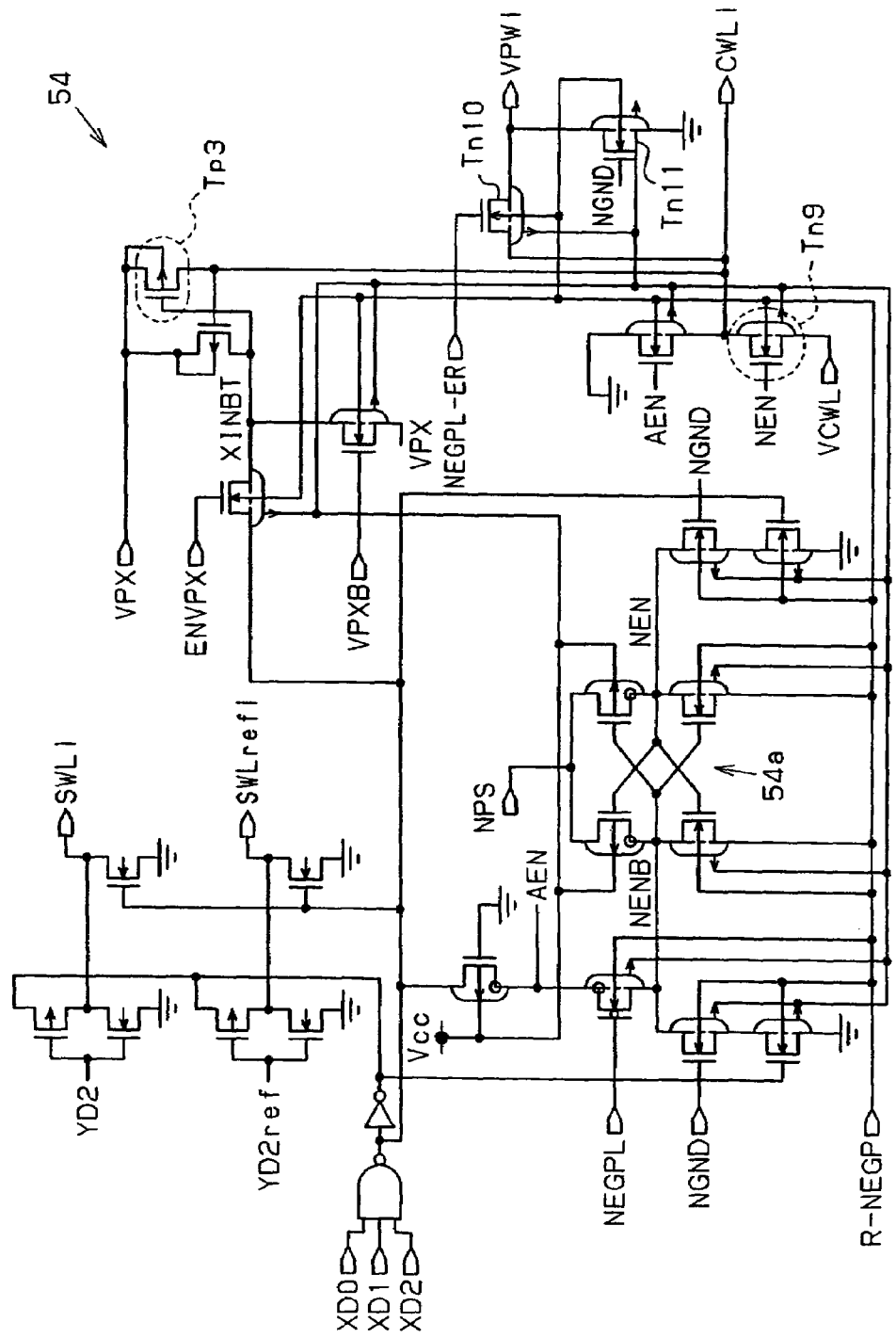
FIG. 18 is a circuit diagram of a word line driver shown in FIG. 4.

FIG. 18 is a circuit diagram showing one example of a configuration the word line driver 54, and FIG. 19 is an operation waveform chart of the same. The word line driver 54 selects one of the control word line CWLi by the pre-decoded signals XD0 to XD2 generated based on the write address WD-ADDR (refer to FIG. 3) during write (erase/program). Further, during reading, the word line driver 54 selects one of the selection word line SWLi and one of the reference cell selection word line SWLrefi with the decoded signals YD2, YD2ref generated based on the read address, which is not shown.

The word line driver 54 includes a latch circuit 54a, and the control signal NPS and the first control voltage R-NEGP are supplied to the latch circuit 54a. The latch circuit 54a latches the control signal NEN based on the control signal NENB generated by the pre-decoded signal XD0 to XD2. More specifically, the latch circuit 54a generates the control signal NEN having a voltage level of the control signal NPS.

The control signal NEGPL becomes an L level when the first control voltage R-NEGP becomes equal to or lower than a predetermined voltage (e.g., equal to or less than −3.0 V) when erasing data, and the control signal NPS becomes an L level (more specifically, ground voltage) based on the control signal NEGPL. Therefore, the latch circuit 54a generates the control signal NEN that becomes the ground voltage based on the control signal NPS. The voltage level of the control signal NGND is equal to the potential of the first control voltage R-NEGP, and thus the latch state of the latch circuit 54a is maintained.

The control signal NEN generated by the latch circuit 54a is input to the gate of the transistor Tn9 (NMOS transistor) serving as the first transistor. The application voltage VCWL is supplied to the source of the transistor Tn9, and the first control voltage R-NEGP of negative voltage (−9.3 V) is supplied to the back gate (P-well) of the transistor Tn9.

Therefore, when erasing data, the transistor Tn9 is turned on, and as shown in FIG. 19, the application voltage VCWL (more specifically, the first control voltage R-NEGP) is supplied to one of the control word lines CWLi selected by the pre-decoded signals XD0 to XD2.

Since the gate voltage (control signal NEN) input to the gate transistor Tn9 becomes the ground voltage, the high voltage that exceeds the breakdown voltage is not applied between the source-gate of the transistor Tn9. When erasing data, the transistor Tn10 is turned on by the control signal NEGPL-ER and the P-well potential VPWi (refer to FIG. 5) of the memory cell 10 becomes the application voltage VCWL (−9.3V).

During programming, the second control voltage VPX of high voltage (+9.5V) is supplied from the second voltage generation circuit 32 to the word line driver 54. The second control voltage VPX is supplied to the source of the transistor Tp3 (PMOS transistor) serving as the second transistor. The control signal XINBT is supplied to the gate of the transistor Tp3. The control signal XINBT becomes an L level by the pre-decoded signals XD0 to XD2 during programming.

Therefore, during programming, the transistor Tp3 is turned on, and as shown in FIG. 19, the second control voltage VPX of high voltage (+9.5V) is supplied to one control word line CWLi selected by the pre-decoded signals XD0 to XD2. The transistor Tn9 is turned on. However, since the application voltage VCWL is controlled (refer to FIG. 17) at the floating potential (e.g., about 2.5 V) during programming, no abnormal current flows to the control word line CWLi. During programming, when the transistor Tn11 is turned on by the control signal NGND, the P-well potential VPWi (refer to FIG. 5) of the memory cell 10 becomes the ground voltage.

Figure 20A:
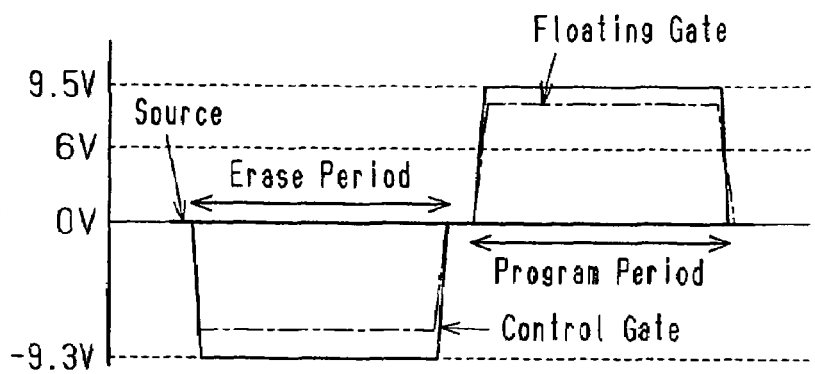
FIG. 20A is a waveform chart showing the writing of data "0"→"0"

The write operation of the flash memory 30 will now be described in detail with reference to FIG. 20A to FIG. 20D. FIG. 20A shows the operation when writing data "0" to the memory cell 10 in which data "0" is presently written. In this case, the second source voltage of ground voltage (0.0V) corresponding to data "0" that is to be written is supplied to the source of the memory cell 10.

In this state, the first control voltage of negative voltage (−9.3 V) is first supplied to control word line CWL. Here, the potential difference between source-floating gate becomes approximately 8.2 V, and the FN tunnel current does not flow. Therefore, the memory cell 10 is not erased, and the amount of charge of the floating gate does not change.

The second control voltage of high voltage (+9.5V) is, then supplied to the control word line CWL while the source voltage is maintained at 0.0 V. In this state, the potential difference between source-floating gate becomes approximately 8.2 V, and the FN tunnel current does not flow. Therefore, the amount of charge of the floating gate does not change. In this case, data "0" of the memory cell before writing data is maintained.

Figure 20B:
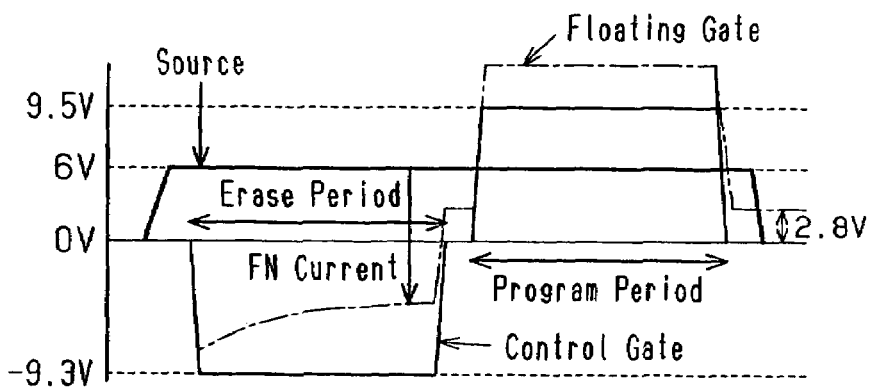
FIG. 20B is a waveform chart showing the writing of data "0"→"1"

FIG. 20B shows an operation of when writing data "1" to the memory cell 10 in which data "0" is presently written. In this case, the first source voltage of high voltage (6.0 V) corresponding to data "1" that is to be written is supplied to the source of the memory cell 10. In this state, the first control voltage of negative voltage (−9.3 V) is first supplied to the control word line CWL. The voltage of approximately 14.2 V is applied between source-floating gate, and the FN tunnel current flows. Therefore, the electrons of the floating gate are eliminated and the memory cell 10 is erased.

The second control voltage of high voltage (+9.5V) is then supplied to the control word line CWL while the source voltage is maintained at 6.0V. In this state, the potential difference between source-floating gate is approximately 5.3 V and the FN tunnel current does not flow. Therefore, the memory cell 10 is not programmed, and the amount of charge of the floating gate does not change. In this case, only erasing is performed, and the data "0" of the memory cell before writing is re-written to data "1".

Figure 20C:
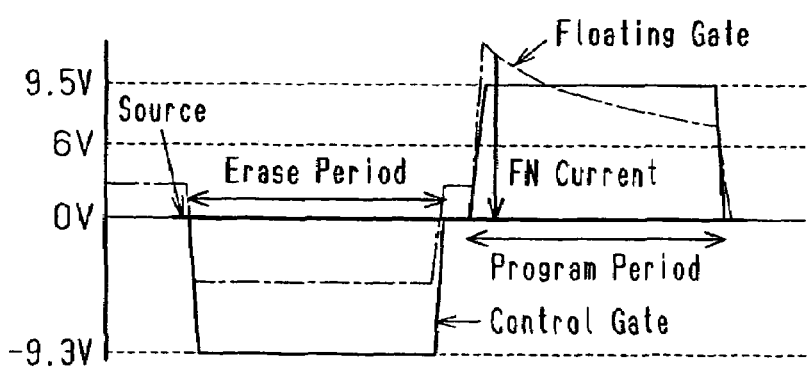
FIG. 20C is a waveform chart showing the writing of data "1"→"0"

FIG. 20C shows the operation of when writing data "0" to the memory cell 10 in which data "1" is presently written. In this case, the second source voltage of ground voltage (0.0 V) corresponding to data "0" that is to be written is supplied to the source of the memory cell 10. In this state, the first control voltage of negative voltage (−9.3V) is first supplied to the control word line CWL. The potential difference between source-floating gate is approximately 5.3 V and the FN tunnel current does not flow. Therefore, the amount of charge of the floating gate does not change.

The second control voltage of high voltage (+9.5V) is then supplied to the control word line CWL while the source voltage is maintained at 0.0 V. The voltage of approximately 11.3 V is applied between source-floating gate, and the FN tunnel current (between source-channel) flows. Therefore, the electrons are injected to the floating gate and the memory cell 10 is programmed. In this case, only programming is performed, and the data "1" of the memory cell before writing is re-written to data "0".

Figure 20D:
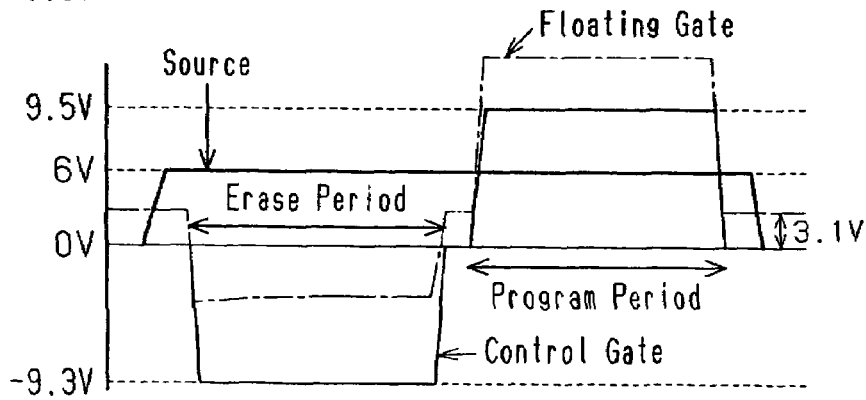
FIG. 20D is a waveform chart showing the writing of data "1"→"1".

FIG. 20D shows an operation of when writing data "1" to the memory cell 10 in which data "1" is presently written. In this case, the first source voltage of high voltage (6.0V) corresponding to data "1" that is to be written is supplied to the source of the memory cell 10. In this state, the first control voltage of negative voltage (−9.3 V) is first supplied to the control word line CWL. The voltage of approximately 11.3 V is applied between source-floating gate, and a slight amount of FN tunnel current flows (there is virtually no flow). Therefore, the amount of charge of the floating gate substantially does not change.

The second control voltage of high voltage (+9.5 V) is then supplied to the control word line CWL while the source voltage is maintained at 6.0 V. In this state, the potential difference between source-floating gate is approximately 5.6 V and the FN tunnel current does not flow. Therefore, the memory cell 10 is not programmed, and the amount of charge of the floating gate does not change. In this case, the data "1" of the memory cell before writing is maintained.

The non-volatile memory of the present embodiment has the following advantages.

(1) The source lines SL separated away from each other for each column unit are arranged in each memory cell 10 of the memory cell array 20. When writing data, one of either the first or the second source voltage is applied to each source line SL in accordance with the data that is to be written. After the first control voltage of negative voltage is applied, the second control voltage of high voltage is applied to the control word line CWL while the voltage of each source line SL is maintained. Therefore, each memory cell 10 is erased or programmed in accordance with the voltage applied to each source line SL. As a result, writing (erasing/programming) is performed entirely to all the memory cells 10 connected to the same control word line CWL, and thus the band width in one write process is significantly improved.

(2) Data is entirely and simultaneously written to all the memory cells 10 connected to the same control word wire CWL. Thus, the time for the write operation is shortened.

(3) Data is entirely and simultaneously written to all the memory cells 10 connected to the same control word wire CWL. Thus, the write consumption current per 1 bit is reduced.

(4) In the present embodiment, by setting the voltage applied to the source line SL as the first source voltage of high voltage corresponding to data "1", all the memory cells connected to the same control word line CWL are entirely erased.

(5) In the present embodiment, by setting the voltage applied to the source line SL as the second source voltage of ground voltage corresponding to data "0", all the memory cells connected to the same control word line CWL are entirely programmed.

(6) The latch circuit 44a for latching the write data is included in the source voltage supply circuit 44 for supplying the source voltage ARVSS (first or second source voltage) to the source line SL, and the power source of high voltage for supplying the second source voltage is supplied to the latch circuit 44a. In this configuration, the level shifter is not necessary in the source voltage supply circuit 44.

(7) The memory cell 10 is configured by a single-layered polysilicon structure, and thus when the memory cell 10 is used for small capacity memory applications, processing steps are reduced.

(8) In the programming of the memory cell 10, the electrons are injected to the floating gate 15 using the FN tunnel current flowing between source-channel. Therefore, the consumption current during program is reduced compared to when using hot electrons with the avalanche breakdown phenomenon.

The above embodiments may be modified as described below.

When writing data, after first applying the second control voltage of high voltage to the control word line CWL and performing programming, the first control voltage of negative voltage may be applied to perform erasing.

The present invention may be embodied in a memory cell of double-layered polysilicon structure (stack-type) that does not have a selection word line. In the memory cell of the stack-type, the control word line CWL and the selection word line SWL share only one word line (selection word line), which is connected to the control gate.

The memory cell 10 of the single-layered polysilicon structure may be a cell having a two element structure that does not include the select transistor 12.

In the present embodiment, all the memory cells 10 connected to the same control word line CWL is subject to writing and entirely written. However, data may also be selectively written to the memory cells 10.

The present examples and embodiments are to be considered as illustrative and not restrictive, and the invention is not to be limited to the details given herein, but may be modified within the scope and equivalence of the appended claims.

What is claimed is:

1. A non-volatile memory comprising:
   a word line;
   a plurality of memory cells connected to the word line;
   a plurality of source lines each connected to one of the plurality of memory cells;
   a plurality of source voltage supply circuits, connected to each source line, for retrieving write data from an associated one of the memory cells and supplying one of either a first source voltage or a second source voltage to the associated source line in accordance with the write data; and
   a pair of reference cells, connected to the word line, for respectively storing a pair of data complementary with respect to each other to generate current that acts as a reference when performing reading.

2. The non-volatile memory according to claim 1, wherein the first source voltage is greater than the second source voltage.

3. The non-volatile memory according to claim 1, wherein:
- the pair of reference cells are connected to a pair of source lines, respectively; and
- the plurality of source voltage supply circuits include a pair of reference cell source voltage supply circuits, connected to the source line connected to each reference cell, each reference cell source voltage supply circuit retrieving write data of an associated one of the reference cells and supplying one of either the first source voltage or the second source voltage to the associated reference cell in accordance with the write data.

4. The non-volatile memory according to claim 1, further comprising a reference control circuit, connected to the pair of reference cells, for reading the pair of data from the pair of reference cells and generating a pair of write data of the pair of reference cells based on the read pair of data.

5. The non-volatile memory according to claim 4, wherein the reference control circuit includes:
- a reference cell read circuit for reading the pair of data from the pair of reference cells in advance when writing data to the plurality of memory cells and determining the polarity of the read pair of data to generate a polarity signal; and
- a reference cell write data generation circuit, connected to the reference cell read circuit, for generating a pair of write data that is to be written next based on the polarity signal so that the write data that is to be written next has a polarity opposite from the pair of data presently written on the pair of reference cells.

6. The non-volatile memory according to claim 1, wherein the pair of data of the pair of reference cells are re-written whenever data is written to the plurality of memory cells.

7. A non-volatile memory comprising:
- a word line;
- a plurality of memory cells connected to the word line;
- a plurality of source lines each connected to one of the plurality of memory cells; and
- a plurality of source voltage supply circuits, connected to each source line, for retrieving write data from an associated one of the memory cells and supplying one of either a first source voltage or a second source voltage to the associated source line in accordance with the write data;
- wherein the source voltage supply circuits includes a latch circuit for latching the write data in response to a decoded signal generated based on a write address.

8. The non-volatile memory according to claim 7, wherein the latch circuit outputs one of either the first source voltage or the second source voltage in accordance with the latched write data.

9. The non-volatile memory according to claim 7, further comprising: a selection word line, connected to the plurality of memory cells, for selecting at least of the plurality of memory cells, wherein each of the pair of reference cells has a single-layered structure and includes a capacitor connected with the word line, a memory transistor connected to the source lines, and a select transistor connected to the selection word line.

10. The non-volatile memory according to claim 9, wherein the selection word line is one of a plurality of selection word lines, wherein the pair of reference cells is connected to bit lines separated from each other and connected to a common selection word line.

11. The non-volatile memory according to claim 7, wherein the first source voltage is greater than the second source voltage.

12. A non-volatile memory comprising:
- a word line;
- a plurality of memory cells connected to the word line;
- a plurality of source lines each connected to one of the plurality of memory cells;
- a plurality of source voltage supply circuits, connected to each source line, for retrieving write data from an associated one of the memory cells and supplying one of either a first source voltage or a second source voltage to the associated source line in accordance with the write data; and
- a word line driver, connected to the word line, for selectively supplying a first control voltage related to erasing and a second control voltage related to programming to the word line.

13. The non-volatile memory according to claim 12, wherein the second control voltage has a higher voltage than the first control voltage.

14. The non-volatile memory according to claim or 13, wherein the word line driver includes:
- a first transistor for generating the first control voltage during the erasing;
- a second transistor for generating the second control voltage during the programming; and
- a signal generation circuit for supplying a gate voltage that is less than a voltage capacity of the first transistor to a gate of the first transistor during the erasing.

15. The non-volatile memory according to claim 12, wherein the first source voltage is greater than the second source voltage.

16. A non-volatile memory comprising:
- a word line;
- a plurality of memory cells connected to the word line;
- a plurality of source lines each connected to one of the plurality of memory cells;
- a plurality of source voltage supply circuits, connected to each source line, for retrieving write data from an associated one of the memory cells and supplying one of either a first source voltage or a second source voltage to the associated source line in accordance with the write data; and
- a selection word line, connected to the plurality of memory cells, used for selecting at least one of the plurality of memory cells, wherein each of the plurality of memory cells has a single-layered polysilicon structure and includes a capacitance connected to the word line, a memory transistor connected to the source lines, and a select transistor connected to the selection word line.

17. The non-volatile memory according to claim 16, wherein:
- the selection word line includes a first selection word line and a second selection word line, and in the plurality of memory cells, the two memory cells adjacent to each other in the word line direction each share a bit line connected to the select transistor of the other memory cell, one of the memory cell of the two memory cells being connected to the first selection word line, and the other memory cell being connected to the second selection word line.

18. The non-volatile memory according to claim 16, wherein the first source voltage is greater than the second source voltage.

19. A write method of a non-volatile memory including a word line, a plurality of memory cells connected to the word line, and a plurality of source lines each connected to one of the plurality of memory cells, the write method comprising:
- a first step for supplying one of either a first source voltage or a second source voltage that is less than the first source voltage to the plurality of source lines in accordance with write data;
- a second step for supplying a first control voltage related to erasing to the word line after the first step; and
- a third step for supplying a second control voltage related to programming to the word line after the second step while maintaining the voltage supplied to each source line in the first step.

20. The write method of the non-volatile memory according to claim 19, wherein the first source voltage is greater than the second source voltage.

21. The write method of the non-volatile memory according to claim 19, wherein the second control voltage is greater than the first control voltage.

22. The write method of the non-volatile memory according to claim 19, wherein only the memory cell applied with the first source voltage is erased in the second step, and only the memory cell applied with the second source voltage is programmed in the third step.

23. A write method of a non-volatile memory including a word line, a plurality of memory cells connected to the word line, and a plurality of source lines each connected to one of the plurality of memory cells, the method comprising:
- a first step for supplying one of either a first source voltage or a second source voltage to the source line connected to each memory cell in accordance with write data;
- a second step for supplying a control voltage related to programming to the word line after the first step; and
- a third step for supplying a control voltage related to erasing to the word line after the second step while maintaining the voltage supplied to each source line in the first step.

24. The write method of the non-volatile memory according to claim 23, wherein the first source voltage is greater than the second source voltage.

25. The write method of the non-volatile memory according to claim 23, wherein the control voltage related to program is greater than the control voltage related to erasing.

26. The write method of the non-volatile memory according to claim 23, wherein only the memory cell applied with the second source voltage is programmed in the second step, and only the memory cell applied with the first source voltage is erased in the third step.

27. The write method of the non-volatile memory according to claim 19, wherein the first step includes retrieving the write data in response to a decoded signal generated based on a write address.

28. The write method of the non-volatile memory according to claim 27, wherein the first step includes retrieving the write data in byte units.

29. The write method of the non-volatile memory according to claim 19, wherein:
- a pair of reference cells to which is written a pair of data complementary to each other for generating a current, which acts as a reference when reading data, is connected to the word line, the pair of reference cells respectively being connected to source lines that are separated from each other;
- the first step includes supplying one of either the first source voltage or the second source voltage to the source line connected to each reference cell in accordance with the write data; and
- a fourth step for writing data to the pair of reference cells simultaneously with the writing of data to
- the plurality of memory cells after performing the second and third steps subsequent to the first step.

30. The write method of the non-volatile memory according to claim 29, wherein the fourth step includes generating a pair of write data of the pair of reference cells so as to have a polarity opposite from the data presently written to the pair of reference cells, respectively.

31. The write method of the non-volatile memory according to claim 29, wherein the fourth step generates the write data of the pair of reference cells using a pair of data read from the pair of reference cells.

32. The write method of the non-volatile memory according to claim 31, wherein the pair of data of the pair of reference cells is read before the first step.

33. The write method of the non-volatile memory according to claim 19, wherein:
- the plurality of memory cells has a single-layered polysilicon structure; and
- erasing and programming of the plurality of memory cells are performed using a tunnel current.

34. The write method of the non-volatile memory according to claim 29, wherein:
- the pair of reference cells has a single-layered polysilicon structure; and
- erasing and programming of the pair of reference cells are performed using a tunnel current.

* * * * *